(12) United States Patent
Goto et al.

(10) Patent No.: US 12,218,633 B2
(45) Date of Patent: Feb. 4, 2025

(54) POWER AMPLIFIER CIRCUIT

(71) Applicant: Murata Manufacturing Co., Ltd., Kyoto (JP)

(72) Inventors: Satoshi Goto, Kyoto (JP); Yoshiki Kogushi, Kyoto (JP); Yuri Honda, Kyoto (JP); Kenichi Shimamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 689 days.

(21) Appl. No.: 17/376,878

(22) Filed: Jul. 15, 2021

(65) Prior Publication Data

US 2022/0021341 A1    Jan. 20, 2022

(30) Foreign Application Priority Data

Jul. 16, 2020 (JP) .................................. 2020-121804
Dec. 28, 2020 (JP) .................................. 2020-219345

(51) Int. Cl.
*H03F 1/02* (2006.01)
*H03F 3/45* (2006.01)

(52) U.S. Cl.
CPC ....... *H03F 1/0216* (2013.01); *H03F 3/45475* (2013.01); *H03F 2200/102* (2013.01)

(58) Field of Classification Search
CPC ............... H03F 1/0216; H03F 3/45475; H03F 2200/102; H03F 2200/451; H03F 3/19; H03F 3/245; H03F 3/26; H03F 1/0222; H03F 3/213; H03F 3/211
USPC ........................................................ 330/261
See application file for complete search history.

(56) References Cited

U.S. PATENT DOCUMENTS

| | | | |
|---|---|---|---|
| 2018/0375474 A1* | 12/2018 | Namie | ................. H03F 3/195 |
| 2020/0136559 A1* | 4/2020 | Shimamoto | ............. H03F 3/191 |
| 2020/0366257 A1* | 11/2020 | Roiz | ........................ H03F 3/21 |

FOREIGN PATENT DOCUMENTS

| | | |
|---|---|---|
| JP | 2012-138677 A | 7/2012 |
| JP | 2018-195954 A | 12/2018 |
| JP | 2020-065244 A | 4/2020 |

* cited by examiner

*Primary Examiner* — Andrea Lindgren Baltzell
*Assistant Examiner* — Jose E Pinero
(74) *Attorney, Agent, or Firm* — McDonald Hopkins LLC

(57) ABSTRACT

A power amplifier circuit according to the present disclosure includes an amplifier circuit serving as a differential amplifier circuit configured to be activated by a supply voltage that is variable in accordance with amplitude of a signal, a bias circuit configured to output a bias to be supplied to the amplifier circuit, and first and second dispersion circuits respectively provided for a pair of differential signals outputted from the amplifier circuit and configured to control dependence of gain of the differential amplifier circuit on the supply voltage.

14 Claims, 15 Drawing Sheets

POWER AMPLIFIER CIRCUIT

CROSS REFERENCE TO RELATED APPLICATIONS

This application claims priority from Japanese Patent Application No. 2020-121804 filed on Jul. 16, 2020, and claims priority from Japanese Patent Application No. 2020-219345 filed on Dec. 28, 2020. The contents of these applications are incorporated herein by reference in their entireties.

BACKGROUND

The present disclosure relates to a power amplifier circuit.

In recent years, concern has arisen about increases in power consumption along with changes to fifth generation mobile communication systems. As a technology for enhancing power efficiency, envelope tracking (ET) is utilized. Envelope tracking is a technology of controlling supply voltage to a power amplifier circuit in accordance with the level of amplitude of input signal. To achieve a high efficiency characteristic with the use of envelope tracking, it is necessary to optimize the range of gain depending on supply voltage (gain dispersion). Gain dispersion denotes differences in gain due to changes in power supply voltage supplied to a transistor. One of the technologies for optimizing the range of gain dispersion according to dependency is a dispersion circuit.

A power amplifier circuit disclosed in Japanese Unexamined Patent Application Publication No. 2020-65244 (Patent Document 1) includes an adjustment circuit. The adjustment circuit adjusts the amount of bias current supplied to an amplifier circuit in accordance with supply voltage controlled by using an envelope of radio-frequency (RF) signals. As a result, the adjustment circuit adjusts the range of gain.

Japanese Unexamined Patent Application Publication No. 2018-195954 (Patent Document 2) describes a power amplifier circuit configured to decrease bias current flowing into the base of a transistor as variable supply voltage supplied from an envelope tracking power supply circuit lowers. The power amplifier circuit described in Patent Document 2 decreases the gain of the transistor as variable supply voltage lowers, as a result, the power amplifier circuit can improve the gain dispersion characteristic. The power amplifier circuit described in Patent Document 2 can reduce increases in gain when supply voltage is relatively low, so that the gain from relatively low supply voltage can be controlled to be substantially equal to the gain from relatively high supply voltage.

BRIEF SUMMARY

The power amplifier circuit described in Patent Document 1 and the power amplifier circuit described in Patent Document 2 have been made without necessarily consideration of gain dispersion in the case in which the amplifier circuit outputs a differential signal, and thus, there is room for improvement.

The present disclosure provides a power amplifier circuit that can achieve appropriate gain dispersion with symmetry of waveforms of differential signals outputted from an amplifier circuit.

A power amplifier circuit according to an aspect of the present disclosure includes a differential amplifier circuit configured to be activated by a supply voltage that is variable in accordance with amplitude of a signal, a bias circuit configured to output a bias to be supplied to the differential amplifier circuit, and first and second dispersion circuits respectively provided for a pair of differential signals outputted from the differential amplifier circuit and configured to control dependence of gain of the differential amplifier circuit on the supply voltage.

A power amplifier circuit according to another aspect of the present disclosure includes a differential amplifier circuit configured to be activated by a supply voltage that is variable in accordance with amplitude of a signal, a bias circuit configured to output a bias to be supplied to the differential amplifier circuit, first and second dispersion circuits respectively provided for a pair of differential signals outputted from the differential amplifier circuit, the first and second dispersion circuits being configured to control dependence of gain of the differential amplifier circuit on the supply voltage, a first resistor provided for one of the pair of differential signals outputted from the differential amplifier circuit, and a second resistor provided for the other of the pair of differential signals. A resistance of the first resistor and a resistance of the second resistor are substantially identical. One end of the first resistor and the one end of the second resistor are coupled to each other. The one of the pair of differential signals is inputted to the other end of the first resistor. The other of the pair of differential signals is inputted to the other end of the second resistor. The first and second dispersion circuits are coupled to the connection point of the one end of the first resistor and the one end of the second resistor.

The present disclosure can achieve appropriate gain dispersion with symmetry of waveforms of differential signals outputted from an amplifier circuit. Other features, elements, characteristics and advantages of the present disclosure will become more apparent from the following detailed description of embodiments of the present disclosure with reference to the attached drawings.

DETAILED DESCRIPTION

Hereinafter, embodiments of a power amplifier circuit of this disclosure will be described in detail with reference to the drawings. It should be noted that the embodiments do not limit the present disclosure. In addition, the constituent elements of the embodiments may include elements easily replaceable by those skilled in the art or substantially identical to each other. The embodiments are mere examples and the configurations described in the different embodiments may be partially replaced or combined with each other. In second and subsequent embodiments, descriptions about specifics common to a first embodiment are not repeated when appropriate, and different points are mainly explained. In particular, almost identical effects and advantages achieved by almost identical configurations are not repeated when appropriate and not mentioned in every embodiment.

Overall Configuration of Transmit Circuit

Figure 1:
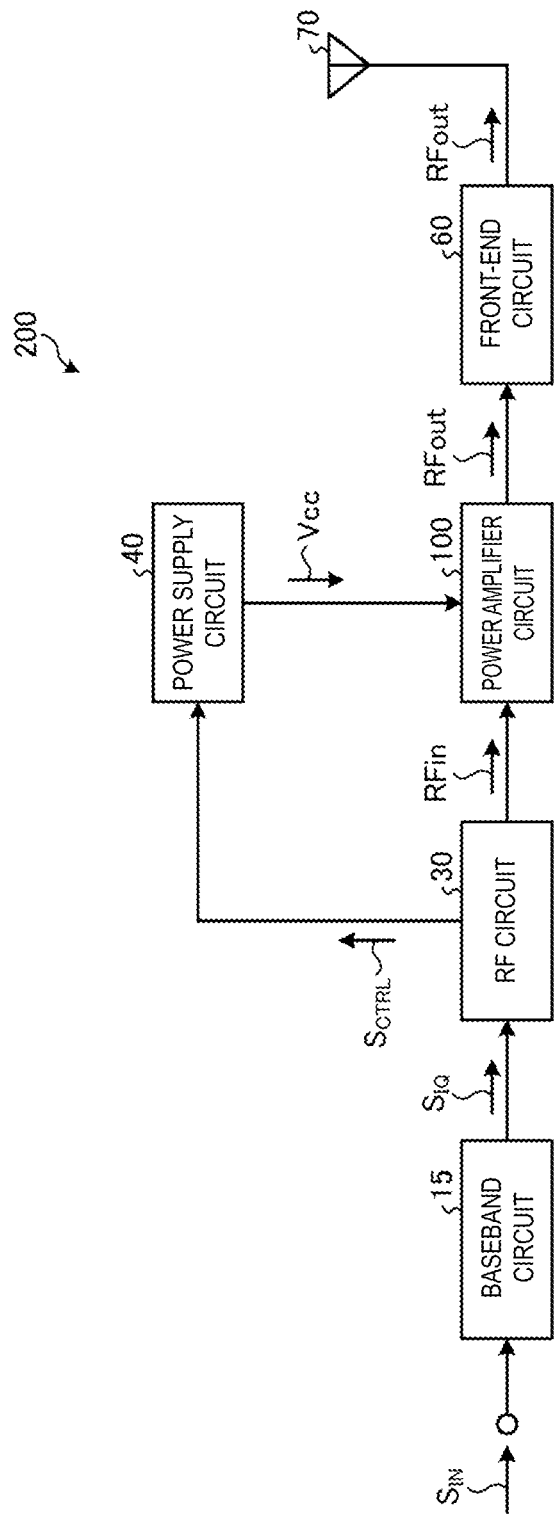
FIG. 1 illustrates an example of a transmit circuit including a power amplifier circuit according to a first embodiment.

FIG. 1 illustrates a configuration of a transmit circuit including a power amplifier circuit according to the first embodiment. The transmit circuit 200 is used in, for example, a wireless communication terminal device, such as a mobile phone to transmit various signals representing, for example, sound and data to base stations. The wireless communication terminal device also includes a receive unit for receiving signals from base stations, but the receive unit is not described.

As illustrated in FIG. 1, the transmit circuit 200 includes a baseband circuit 15, a radio-frequency (RF) circuit 30, a power supply circuit 40, a power amplifier circuit 100, a front-end circuit 60, and an antenna 70.

The baseband circuit 15 modulates an input signal $S_{IN}$, which represents, for example, sound or data, in accordance with a modulation technology, such as High Speed Uplink Packet Access (HSUPA) or Long Term Evolution (LTE) and outputs a modulated signal $S_{IQ}$. The modulated signal $S_{IQ}$ is an IQ signal (I signal and Q signal) which represents amplitude and phase plotted on the IQ plane.

The RF circuit 30 outputs a radio-frequency input signal RFin based on the modulated signal $S_{IQ}$ outputted from the baseband circuit 15. The RF circuit 30 also detects the amplitude level of the modulated signal $S_{IQ}$. The RF circuit 30 accordingly outputs to the power supply circuit 40 a control signal $S_{CTRL}$ for controlling the power supply circuit 40 to supply a supply voltage Vcc of a level corresponding to the amplitude level of the input signal RFin to the power amplifier circuit 100. Specifically, the RF circuit 30 outputs to the power supply circuit 40 a control signal $S_{CTRL}$ for controlling the power supply circuit 40 to make the level of the supply voltage Vcc corresponding to the envelope of the input signal RFin. This means that the RF circuit 30 outputs the control signal $S_{CTRL}$ to the power supply circuit 40 to perform envelope tracking.

Instead of directly converting the modulated signal $S_{IQ}$ into the input signal RFin, the RF circuit 30 may firstly convert the modulated signal $S_{IQ}$ to an intermediate-frequency (IF) signal and then generate the input signal RFin based on the IF signal.

The power supply circuit 40 is an envelope-tracking power supply circuit configured to generate the supply voltage Vcc of a level corresponding to the control signal $S_{CTRL}$ outputted from the RF circuit 30, that is, a level corresponding to the envelope of the input signal RFin and outputs the supply voltage Vcc to the power amplifier circuit 100. The power supply circuit 40 may be constituted by, for example, a DC-DC converter configured to generate the supply voltage Vcc of a level corresponding to the control signal $S_{CTRL}$ from an input voltage and a linear amplifier.

The supply voltage Vcc changes in accordance with the envelope of the input signal RFin.

For example, in a mobile communication device, such as a mobile phone, the power amplifier circuit 100 amplifies the radio-frequency input signal RFin and outputs a radio-frequency output signal RFout. The frequency of the input signal RFin and the output signal RFout may range, for example, from about several hundreds of megahertz (MHz) to about several tens of gigahertz (GHz), but the present disclosure is not limited to this example.

The power amplifier circuit 100 amplifies the power of the input signal RFin outputted from the RF circuit 30 to a level necessary to transmit the signal to a base station. The power amplifier circuit 100 outputs the amplified output signal RFout to the front-end circuit 60.

The front-end circuit 60 performs operations including filtering for the output signal RFout and switching between the output signal RFout and a receive signal received from a base station. The output signal RFout outputted from the front-end circuit 60 is transmitted via the antenna 70 to a base station.

The power amplifier circuit 100 may be implemented as a hybrid integrated circuit (also referred to as a module) formed by mounting a plurality of components including a semiconductor integrated circuit at a single substrate, but the present disclosure is not limited to this example.

Comparative Example

Figure 2:
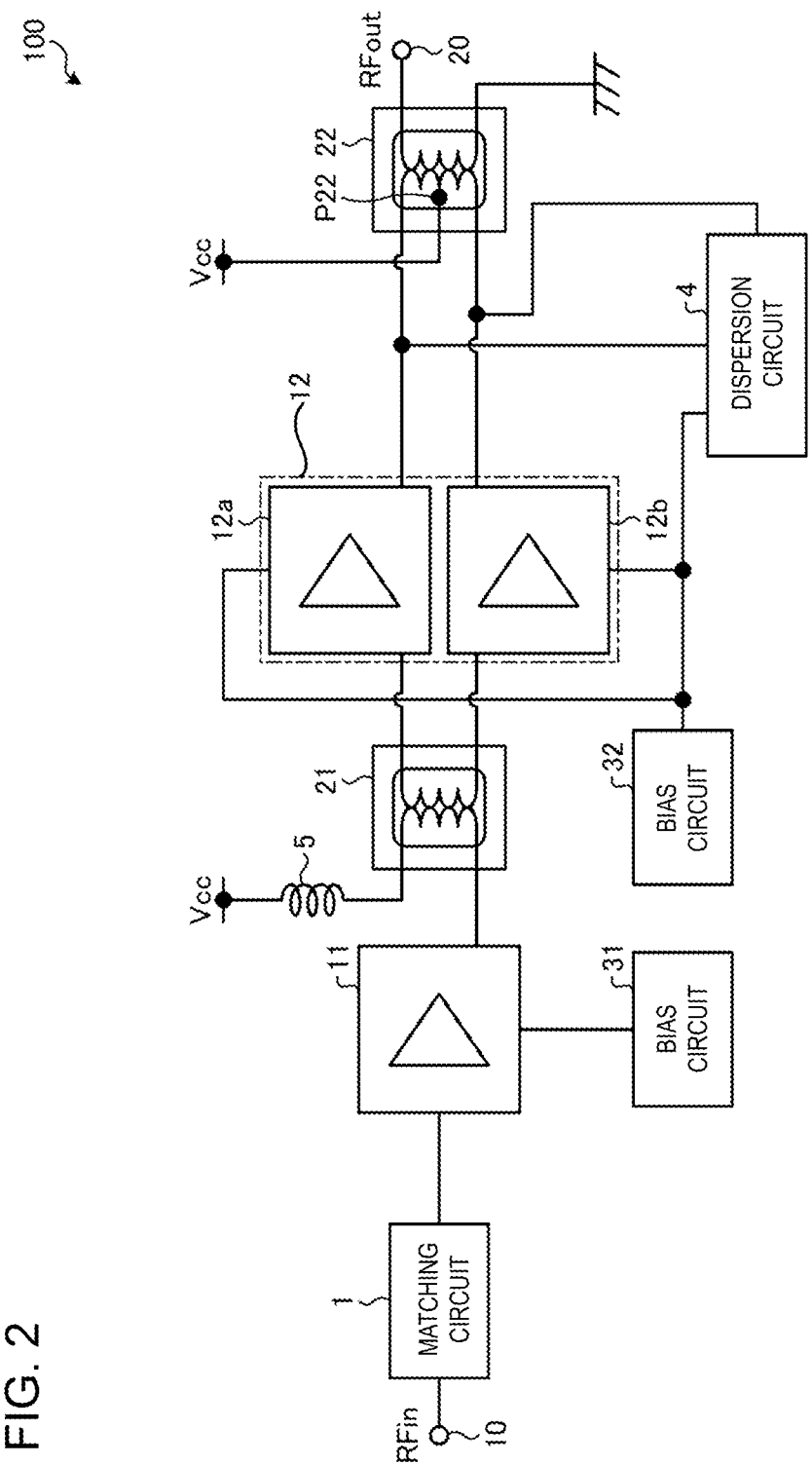
FIG. 2 illustrates a power amplifier circuit of a comparative example.

Next, for ease of understanding of the embodiments, a power amplifier circuit of a comparative example will be described. FIG. 2 illustrates the power amplifier circuit of the comparative example. The power amplifier circuit 100 illustrated in FIG. 2 includes a matching network 1, an amplifier circuit 11, a transformer 21, which is a first transformer, an amplifier circuit 12, and a transformer 22, which is a second transformer. The input signal RFin is inputted to an input terminal 10. The matching network 1 is provided between the input terminal 10 and the amplifier circuit 11. The matching network 1 is positioned on the input side with respect to the amplifier circuit 11.

The transformer 21 is provided between the amplifier circuit 11 and the amplifier circuit 12. The amplifier circuit 11 is an amplifier circuit in the drive stage. The amplifier circuit 12 is an amplifier circuit in the power stage. The transformer 21 is positioned on the output side with respect to the amplifier circuit 11. The transformer 21 is positioned on the input side with respect to the amplifier circuit 12. One end of a winding on the input side of the transformer 21 is coupled to the output terminal of the amplifier circuit 11. The other end of the winding on the input side of the transformer 21 is coupled to the supply voltage Vcc via an inductor 5.

A winding on the output side of the transformer 21 is coupled to the input side of the amplifier circuit 12. The amplifier circuit 12 includes amplifier circuits 12a and 12b, which form a differential amplifier circuit. Differential signals outputted from the amplifier circuits 12a and 12b are inputted to the transformer 22. The transformer 22 is provided between the amplifier circuit 12 and an output terminal 20. The transformer 22 is positioned on the output side with respect to the amplifier circuit 12. A midpoint P22 of a winding on the primary side of the transformer 22 is coupled to the supply voltage Vcc. One end of a winding on the secondary side of the transformer 22 is coupled to the output terminal 20. The other end of the winding on the secondary side of the transformer 22 is coupled to a reference potential. The output signal RFout is outputted from the output terminal 20 as an output signal from the power amplifier circuit 100.

A bias circuit 31 is coupled to the amplifier circuit 11. The bias circuit 31 outputs a bias to be supplied to the amplifier circuit 11. The bias outputted from the bias circuit 31 is inputted to the amplifier circuit 11. A bias circuit 32 is coupled to the amplifier circuit 12. The bias circuit 32 outputs a bias to be supplied to the amplifier circuit 12. The bias outputted from the bias circuit 32 is inputted to both the amplifier circuits 12a and 12b forming the differential amplifier circuit.

The power amplifier circuit 100 further includes a dispersion circuit 4. The power amplifier circuit 100 includes the single dispersion circuit 4 on the output side with respect to the amplifier circuit 12. The single dispersion circuit 4 is provided for a pair of differential signals outputted from the amplifier circuit 12. In accordance with one of the differential signals in a pair outputted from the amplifier circuit 12, the dispersion circuit 4 controls a bias to be supplied to the amplifier circuit 12. Hence, it is difficult to maintain the symmetry of waveforms of the differential signals outputted from the amplifier circuit 12.

Dispersion Circuit and Bias Circuit

Figure 3:
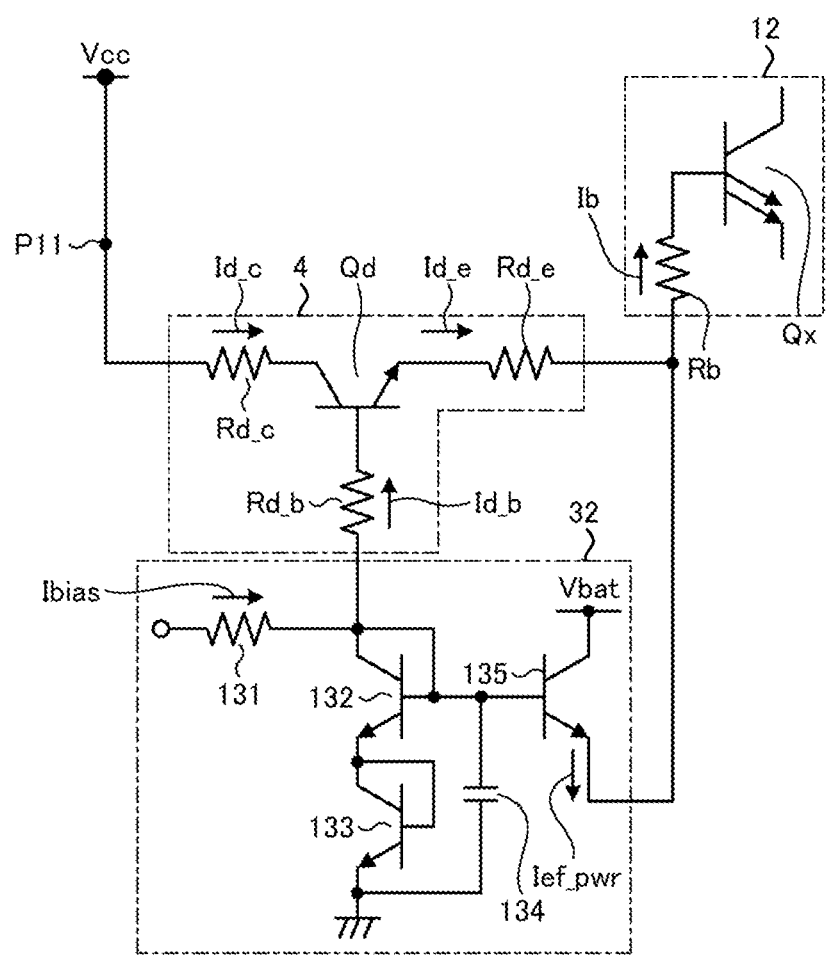
FIG. 3 illustrates a configuration example of a dispersion circuit and a bias circuit.

FIG. 3 illustrates a configuration example of the dispersion circuit 4 and the bias circuit 32. In accordance with the signal outputted from the dispersion circuit 4, the bias circuit 32 changes the bias to be outputted. This means that the dispersion circuit 4 and the bias circuit 32 controls the bias to be supplied to the amplifier circuit 12.

In FIG. 3, when the bias circuit 32 is brought into focus, the bias circuit 32 includes a resistance element 131, transistors 132, 133, and 135, a capacitor 134.

For example, a bias current Ibias of a constant amount is inputted to the one end of the resistance element 131. The other end of the resistance element 131 is electrically coupled to the collector and base of the transistor 132. A bias voltage may be inputted to the resistance element 131.

The collector and base of the transistor 132 are electrically coupled to each other. This means that the transistor 132 is diode-connected. The emitter of the transistor 132 is electrically coupled to the collector and base of the transistor 133.

The collector and base of the transistor 133 are electrically coupled to each other. This means that the transistor 133 is diode-connected. The emitter of the transistor 133 is electrically coupled to the reference potential.

One end of the capacitor 134 is electrically coupled to the collector and base of the transistor 132. The other end of the capacitor 134 is electrically coupled to the reference potential. The capacitor 134 stabilizes the voltage across the transistors 132 and 133, that is, voltage across two diodes.

The collector of the transistor 135 is electrically coupled to a supply voltage Vbat of a constant level. The base of the transistor 135 is electrically coupled to the one end of the capacitor 134. A constant amount of bias current is inputted to the base of the transistor 135. The emitter of the transistor 135 is coupled to the amplifier circuit 12. The transistor 135 outputs a current Ief_pwr of a constant amount to the amplifier circuit 12.

In FIG. 3, when the dispersion circuit 4 is brought into focus, the dispersion circuit 4 includes a transistor Qd and resistance elements Rd_b, Rd_c, and Rd_e. The resistance elements Rd_b, Rd_c, and Rd_e may be interconnect resistances.

The transistor Qd is a heterojunction bipolar transistor having an emitter and a base creating a heterojunction. The band gap energy of the emitter is greater than the band gap energy of the base.

One end of the resistance element Rd_b is electrically coupled to the base of the transistor 135 and the one end of the capacitor 134 of the bias circuit 32. The other end of the resistance element Rd_b is electrically coupled to the base of the transistor Qd.

The supply voltage Vcc, which is an envelope-tracking supply voltage, is inputted to one end of the resistance element Rd_c. The other end of the resistance element Rd_c is electrically coupled to the collector of the transistor Qd.

One end of the resistance element Rd_e is electrically coupled to the emitter of the transistor Qd. The other end of the resistance element Rd_e is electrically coupled to the amplifier circuit 12. The resistance element Rd_e is not necessarily provided. This means that the emitter of the transistor Qd may be directly coupled to one end of a resistance element Rb.

The electric potential at the one end of the resistance element Rd_b is determined by the electric potential (constant potential) at the capacitor 134. The electric potential at the one end of the resistance element Rd_c is determined by the supply voltage Vcc, which is an envelope-tracking supply voltage. As a result, the operation of the transistor Qd changes in accordance with the supply voltage Vcc.

A bias current Ib is the total of the current Ief_pwr and a current Id_e, that is, Ib=Ief_pwr+Id_e, where the current Ief_pwr is an emitter current of the transistor 135 and the current Id_e is an emitter current of the transistor Qd. Thus, the current Ief_pwr and the current Id_e contribute to adjustment of bias point of a transistor in the amplifier circuit 12.

The dispersion circuit 4 outputs the current Id_e in accordance with the supply voltage Vcc via the resistance element Rd_e to the amplifier circuit 12, such that the dispersion circuit 4 controls bias current.

In the present disclosure, the lower limit voltage of the supply voltage Vcc is referred to as a first voltage, and the upper limit voltage of the supply voltage Vcc is referred to as a second voltage. The first voltage may be, for example, about 1.0 V, but the present disclosure is not limited to this example. The second voltage may be, for example, about 5.5 V, but the present disclosure is not limited to this example.

The transistor Qd is a heterojunction bipolar transistor. Thus, after the supply voltage Vcc exceeds a third voltage (threshold voltage) higher than the first voltage, the transistor Qd operates in a different manner. The third voltage may be, for example, about 3 V, but the present disclosure is not limited to this example.

When the supply voltage Vcc is within the range higher the third voltage, the transistor Qd operates as an emitter follower circuit. By contrast, when the supply voltage Vcc is within the range equal to or lower than the third voltage, the transistor Qd operates as two p-n junction diodes (p-n junction between base and collector and p-n junction between base and emitter).

In the present disclosure, a first current path denotes a path along which current flows from the bias circuit 32 via the resistance element Rb to the base of a transistor Qx in the amplifier circuit 12. The first current path electrically connects the emitter of the transistor 135 and the base of the transistor Qx in the amplifier circuit 12. The emitter of the transistor Qd is electrically coupled to the first current path via the resistance element Rd_e.

A second current path denotes a path along which current flows from the bias circuit 32 via the resistance element Rd_b, the p-n junction between the base and collector of the transistor Qd, and the resistance element Rd_c to a connection point P11. The base of the transistor 135 is coupled to the second current path via the resistance element Rd_b.

A third current path denotes a path along which current flows from the connection point P11 via the resistance element Rd_c, the collector and emitter of the transistor Qd, the resistance element Rd_e, and the resistance element Rb to the base of the transistor Qx in the amplifier circuit 12.

Case of transistor operating as emitter follower circuit

The following is a description of the case in which the transistor Qd operates as an emitter follower circuit. In this case, the current Ief_pwr flows from the bias circuit 32 via the first current path to the base of the transistor Qx. At the same time, the current Id_e flows from the connection point P11 through the third current path to the base of the transistor Qx. At this time, a current Id_b is negligibly small, and thus, the current Id_e is almost equal to a current Id_c; that is, Id_e≈Id_c.

Case of Transistor Operating as Two p-n Junction Diodes

The following is a description of the case in which the transistor Qd operates as two p-n junction diodes. In this case, current flows from the bias circuit 32 through the second current path to the connection point P11. This is because the on-voltage of the p-n junction between the base and collector of the transistor Qd is lower than the on-voltage of the p-n junction between the base and emitter of the transistor Qd; thus, current flows more easily between the base and collector of the transistor Qd than the base and emitter of the transistor Qd. At this time, the current Id_c flows in a direction opposite to the direction indicated by the arrow in FIG. 3.

In the dispersion circuit 4, the current Id_c increases in the direction (opposite direction) from the bias circuit 32 through the second current path to the connection point P11, as the supply voltage Vcc decreases. In other words, in the dispersion circuit 4, as the supply voltage Vcc decreases, the current Id_b flowing as the current Id_c in the direction (opposite direction) to the connection point P11 along the second current path increases, and as a result, the current flowing in the base of the transistor 135 decreases. This means that, as the supply voltage Vcc decreases, the dispersion circuit 4 decreases the current flowing into the base of the transistor 135. This decreases the current Ief_pwr and consequently decreases the bias current Ib.

Thus, a collector current Icc of the transistor Qx also decreases. As such, when the supply voltage Vcc is within the range equal to or lower than the third voltage, the dispersion circuit 4 can decrease the gain of the transistor Qx. For example, when the supply voltage Vcc is the first voltage, that is, the lower limit voltage, the dispersion circuit 4 can decrease the gain of the transistor Qx from the gain at the time when the transistor Qx outputs the highest power with the maximum efficiency. Accordingly, the dispersion circuit 4 can improve the gain dispersion characteristic of the power amplifier circuit. This means that the dispersion circuit 4 controls the dependence of gain of the amplifier circuit 12 on supply voltage.

Another Example of Bias Circuit

Figure 4:
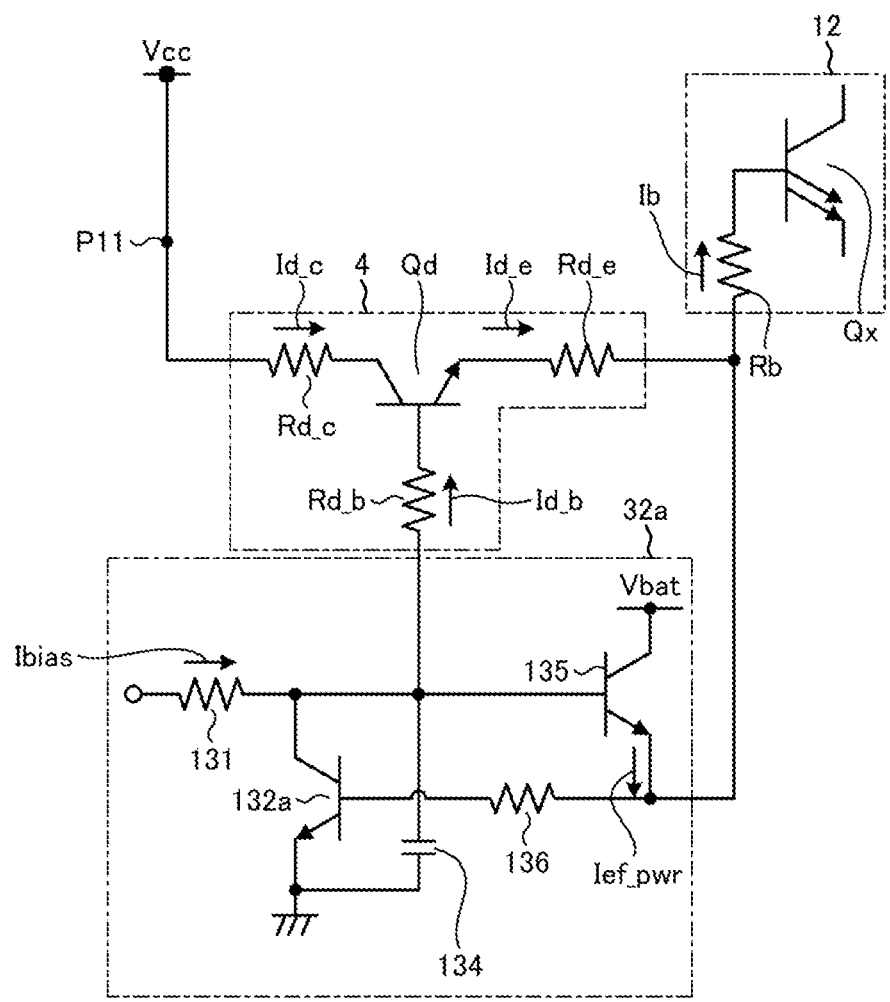
FIG. 4 illustrates another configuration example of the dispersion circuit and the bias circuit.

FIG. 4 illustrates another configuration example of the dispersion circuit and the bias circuit. In FIG. 4, the bias circuit 32 in FIG. 3 is replaced with another bias circuit 32a. The bias circuit 32a is a feedback bias circuit. The bias circuit 32a includes a transistor 132a and a resistor 136. One end of the resistor 136 is coupled to the emitter of the transistor 135. The other end of the resistor 136 is coupled to the base of the transistor 132a. The collector of the transistor 132a is coupled to the base of the transistor 135. The emitter of the transistor 132a is coupled to the reference potential. Other parts of the configuration of the bias circuit 32a are identical to those of the configuration of the bias circuit 32 described with reference to FIG. 3.

The following is a description of an operation of the bias circuit 32a. The current Ief_pwr outputted from the emitter of the transistor 135 is inputted to the amplifier circuit 12. The current Ief_pwr partially flows toward the resistor 136. Thus, the transistor 132a is constantly in the on-state.

As the current Ief_pwr increases, the current flowing to the resistor 136 increases. This increases the current flowing in the base of the transistor 132a. As a result, the bias current Ibias flows more toward the transistor 135. Consequently, the voltage across the base and emitter of the transistor 135 decreases, and thus, the current Ief_pwr decreases.

By contrast, as the current Ief_pwr decreases, the current flowing in the resistor 136 decreases. This decreases the current flowing in the base of the transistor 132a. As a result, the bias current Ibias flows less toward the transistor 135. Consequently, the voltage across the base and emitter of the transistor 135 increases, and thus, the current Ief_pwr increases.

As described above, the transistor 132a and the resistor 136 operate as a feedback circuit that feeds back part of the current Ief_pwr. This means that the bias circuit 32a in FIG. 4 includes a feedback circuit that feeds back part of the current Ief_pwr. Because the feedback circuit controls the on-state of the transistor 132a, it is possible to maintain a constant amount of bias current supplied from the bias circuit 32a to the amplifier circuit 12. In other words, feeding back part of the bias can maintain a constant level of bias to be supplied to the power amplifier circuit. As a result, excellent linearity of gain of the power amplifier circuit can be maintained.

Operational Characteristics of Dispersion Circuit

Figure 5:
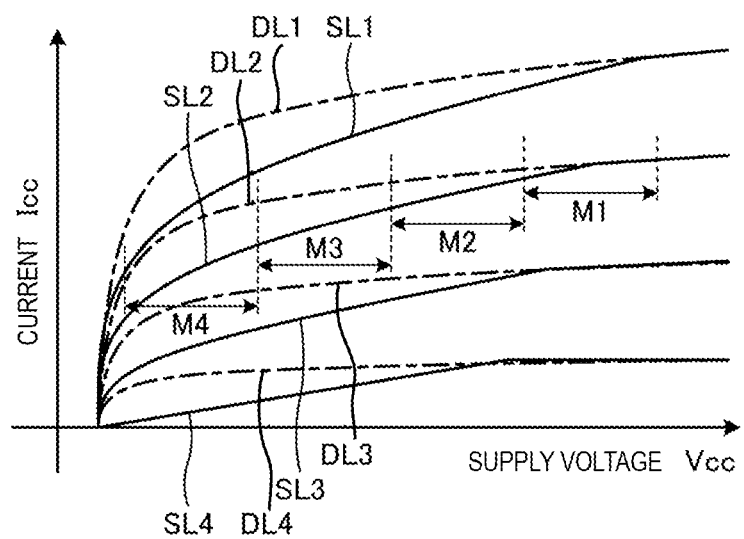
FIG. 5 illustrates an operational characteristic of the dispersion circuit.
Figure 6:
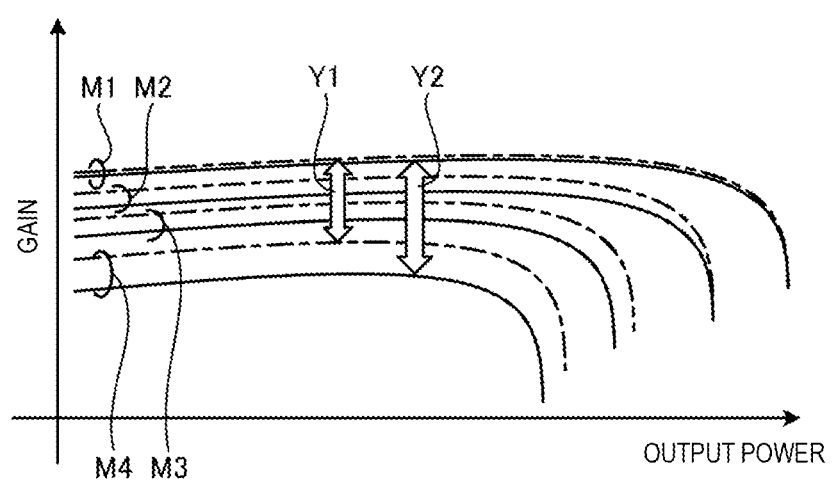
FIG. 6 illustrates another operational characteristic of the dispersion circuit.

FIGS. 5 and 6 illustrate operational characteristics of the dispersion circuit 4. FIG. 5 illustrates a characteristic of the collector current Icc to the supply voltage Vcc with respect to the bias current Ibias. In FIG. 5, the horizontal axis indicates the supply voltage Vcc, and the vertical axis indicates the collector current Icc.

In FIG. 5, dot-dash lines DL1 to DL4 represent operational characteristics in the case without necessarily the dispersion circuit 4, and solid lines SL1 to SL4 represent operational characteristics in the case with the dispersion circuit 4. The dot-dash line DL1 and the solid line SL1 indicate the case with the same bias current Ibias of a relatively large amount. The dot-dash line DL4 and the solid line SL4 indicate the case with the same bias current Ibias of a relatively small amount. As illustrated in FIG. 5, bringing into focus the operational characteristics of the dot-dash lines DL1 to DL4 in the case without necessarily the dispersion circuit 4, when the supply voltage Vcc decreases, the collector current Icc remains at almost the same amount or gradually decreases with respect to the different amounts of the bias current Ibias.

In contrast, bringing into focus the solid lines SL1 to SL4 in the case with the dispersion circuit 4 with respect to the different amounts of the bias current Ibias, while the supply voltage Vcc is relatively high, the solid lines SL1 to SL4 almost coincide with the dot-dash lines DL1 to DL4. This means that, when the supply voltage Vcc is relatively high, the operational characteristics in the case with the dispersion circuit 4 are almost identical to the operational characteristics in the case without necessarily the dispersion circuit 4. When the supply voltage Vcc is relatively low, the dispersion circuit 4 draws current from the bias circuit 32 to decrease the collector current Icc. In this example, as the supply voltage Vcc decreases, the operational characteristics represented by the solid lines SL1 to SL4 linearly decreases with more greatly decreasing collector current Icc than the operational characteristics represented by the dot-dash lines DL1 to DL4. As such, in the case with the dispersion circuit 4, the collector current Icc changes in the range of a relatively lower area in FIG. 5. As described above, as the supply voltage Vcc increases, the amount of current drawn by the dispersion circuit 4 from the bias circuit 32 decreases. Hence, when the supply voltage Vcc is relatively high, the operational characteristics represented by the solid lines SL1 to SL4 are almost identical to the operational characteristics represented by the dot-dash lines DL1 to DL4 as described above. Here, the dot-dash line DL2 and the solid line SL2 are brought into focus. The dot-dash line DL2 and the solid line SL2 can be divided into a plurality of sections, for example, four sections M1, M2, M3, and M4 with respect to the supply voltage Vcc. Among the four sections M1, M2, M3, and M4, the section M1 is a section including a highest supply voltage. Among the four sections M1, M2, M3, and M4, the section M4 is a section including a lowest supply voltage. An example of variations in gain with respect to the sections M1, M2, M3 and M4 of the supply voltage Vcc will be described with reference to FIG. 6. It should be noted that gain increases or decreases in proportion to the collector current Icc.

FIG. 6 illustrates a characteristic of gain to power. In FIG. 6, the horizontal axis indicates output power, and the vertical axis indicates gain. In FIG. 6, dot-dash lines represent operational characteristics in the respective sections M1 to M4 in FIG. 5 in the case without necessarily the dispersion circuit 4. In FIG. 6, solid lines represent operational characteristics in the case with the dispersion circuit 4.

As illustrated in FIG. 6, in the case without necessarily the dispersion circuit 4, the operational characteristics corresponding to the sections M1 to M4 in FIG. 5 represented by the dot-dash lines indicate that, while output power is relatively high, gain steeply decreases. In the case without necessarily the dispersion circuit 4, gain varies in the range indicated by an arrow Y1 among the operational characteristics corresponding to the sections M1 to M4.

By contrast, in the case with the dispersion circuit 4, the operational characteristics corresponding to the sections M1 to M4 in FIG. 5 indicate that gain decreases, as represented by the solid lines. In particular, the operational characteristic corresponding to the section M4 in FIG. 5 indicates the largest decrease in gain. In the case with the dispersion circuit 4, gain varies in the range indicated by an arrow Y2 among the operational characteristics corresponding to the sections M1 to M4. This means that, in the case with the dispersion circuit 4, gain varies in a wider range as indicated by the arrow Y2. As such, coupling the dispersion circuit 4 to the bias circuit 32 can widen the range of variations in gain. The other lines in FIG. 5, namely the solid line SL1 and the dot-dash line DL1, the solid line SL3 and the dot-dash line DL3, and the solid line SL4 and the dot-dash line DL4, can also be divided into a plurality of sections in the same manner. Coupling the dispersion circuit 4 to the bias circuit 32 can also widen the range of variations in gain among the operational characteristics corresponding to the respective sections as illustrated in FIG. 6.

In the power amplifier circuit 100 according to the comparative example illustrated in FIG. 2, the dispersion circuit 4 is coupled to the amplifier circuit 11. Thus, when the amplifier circuit 11 is a differential amplifier circuit, a difference in the interconnection length yields an asymmetrical arrangement, and as a result, the differential amplifier circuit cannot achieve symmetry.

Hereinafter, a power amplifier circuit according to the present disclosure will be described. The power amplifier circuit according to the present disclosure includes gain dispersion circuits corresponding to amplifier circuits forming a differential amplifier circuit.

First Embodiment

Circuit Configuration

Figure 7:
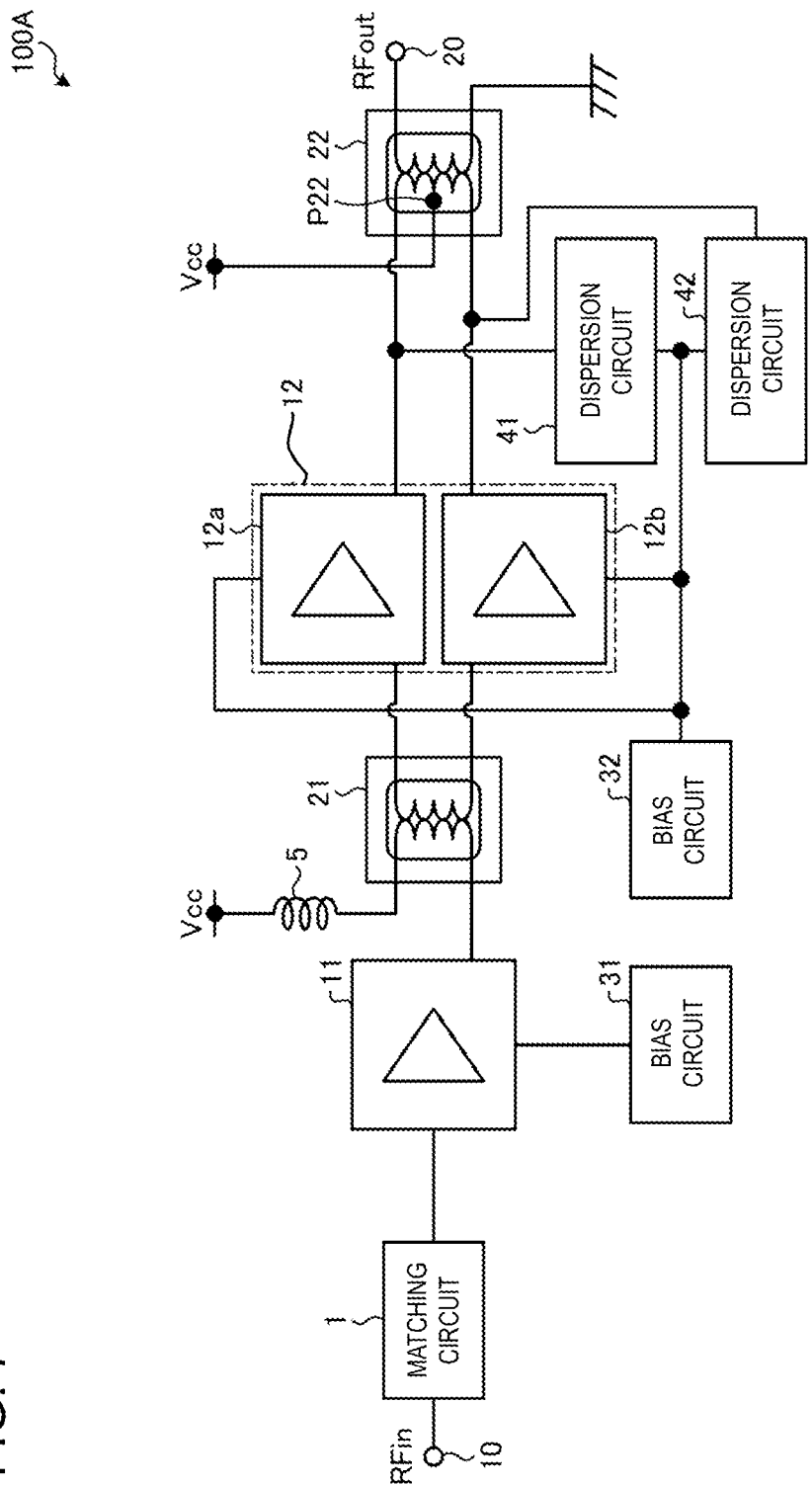
FIG. 7 illustrates an example of a power amplifier circuit according to a first embodiment.

FIG. 7 illustrates an example of a power amplifier circuit 100A according to the first embodiment. The power amplifier circuit 100A illustrated in FIG. 7, which is installed in, for example, a mobile communication device, such as a mobile phone, amplifies the power of the input signal RFin to a level necessary to transmit the signal to a base station and outputs the amplified signal as the output signal RFout. The input signal RFin may be an RF signal modulated by, for example, a radio-frequency integrated circuit (RFIC) in accordance with a given communication system. Examples of the communication standard of the input signal RFin include the second generation (2G), third generation (3G), fourth generation (4G), and fifth generation (5G) technology standards for cellular networks, Long Term Evolution (LTE) for Frequency Division Duplex (FDD), LTE for Time Division Duplex (TDD), LTE-Advanced, and LTE-Advanced Pro. The frequency of the input signal RFin may range, for example, from about several hundreds of MHz to about several tens of GHz. The communication standard and frequency of the input signal RFin are not limited to these examples.

The power amplifier circuit 100A illustrated in FIG. 7 includes the amplifier circuit 11 in an anterior stage (drive stage), which is a first amplifier circuit, and the amplifier circuit 12 in a posterior stage (power stage), which is a second amplifier circuit. The power amplifier circuit 100A includes the matching network 1 on the input side with respect to the amplifier circuit 11, the transformer 21 as the first transformer between the amplifier circuit 11 and the amplifier circuit 12, and the transformer 22 as the second transformer on the output side with respect to the amplifier circuit 12. The power amplifier circuit 100A further includes the inductor 5.

The input signal RFin, which is inputted from the input terminal 10, is inputted to the matching network (MN) 1. The matching network 1 matches the impedance of a preceding-stage circuit (not illustrated in the drawing) and the impedance of the amplifier circuit 11.

The amplifier circuits 11 and 12 amplify an inputted signal and output the amplified signal. The amplifier circuits 11 and 12 are implemented as transistors, such as heterojunction bipolar transistors (HBTs). The amplifier circuits 11 and 12 may be implemented as field effect transistors, such as metal-oxide-semiconductor field effect transistors (MOSFETs) instead of HBTs. In this case, collector, base, and emitter are respectively regarded as drain, gate, and source.

The power amplifier circuit 100A includes the bias circuits 31 and 32. The bias circuit 31 supplies a bias to the amplifier circuit 11. The bias circuit 32 supplies a bias to the amplifier circuit 12.

The output terminal of the amplifier circuit 11 is coupled to one end of a primary winding of the transformer 21. The other end of the primary winding of the transformer 21 is coupled to the supply voltage Vcc via the inductor 5. The supply voltage Vcc is controlled in accordance with an envelope of RF signals. The power amplifier circuit 100 is activated by supply voltage that is variable in accordance with envelope tracking. Electromagnetic coupling occurs between the primary winding and a secondary winding of the transformer 21, and as a result, a signal is transferred from the primary winding to the secondary winding.

The midpoint (center tap) of the primary winding of the transformer 22 is coupled to the supply voltage Vcc. The one end of the secondary winding of the transformer 22 is coupled to the output terminal 20. Electromagnetic coupling occurs between the primary winding and secondary winding of the transformer 22, and as a result, a signal is transferred from the primary winding to the secondary winding.

The power amplifier circuit 100A includes a dispersion circuit 41, which is a first dispersion circuit, and a dispersion circuit 42, which is a second dispersion circuit. The dispersion circuits 41 and 42 are respectively provided for differential signals in a pair outputted from the amplifier circuit 12. The dispersion circuits 41 and 42 are coupled to the bias circuit 32 for the power stage. The dispersion circuits 41 and 42 control a bias to be supplied to the amplifier circuit 12. The dispersion circuits 41 and 42 control the dependence of gain of the amplifier circuit 12 on supply voltage.

Operation

The input signal RFin inputted from the input terminal 10 is inputted to the amplifier circuit 11 via the matching network 1. The amplifier circuit 11 amplifies the inputted signal and output the amplified signal. The amplifier circuit 11 outputs a single-ended signal. The output signal from the amplifier circuit 11 is inputted to the one end of the primary winding of the transformer 21.

The signal from the secondary winding of the transformer 21 is inputted to the amplifier circuit 12. The amplifier circuit 12 amplifies the signal inputted through the transformer 21. The amplifier circuit 12 outputs the amplified signal as a pair of differential signals. The pair of differential signals outputted from the amplifier circuit 12 are inputted to the primary winding of the transformer 22. Consequently, the output signal RFout, which is a single-ended signal, is outputted from the secondary winding of the transformer 22 to the output terminal 20.

The bias circuit 31 supplies a bias (that is, a bias current or bias voltage) to the base or gate of the amplifier circuit 11. The bias circuit 32 supplies a bias (that is, a bias current or bias voltage) to the amplifier circuits 12a and 12b constituting the amplifier circuit 12. In accordance with the differential signals in a pair outputted from the amplifier circuit 12, the dispersion circuits 41 and 42 control the bias to be supplied to the amplifier circuit 12. As a result, the bias controlled by the dispersion circuits 41 and 42 is supplied to the amplifier circuit 12.

Figure 8:
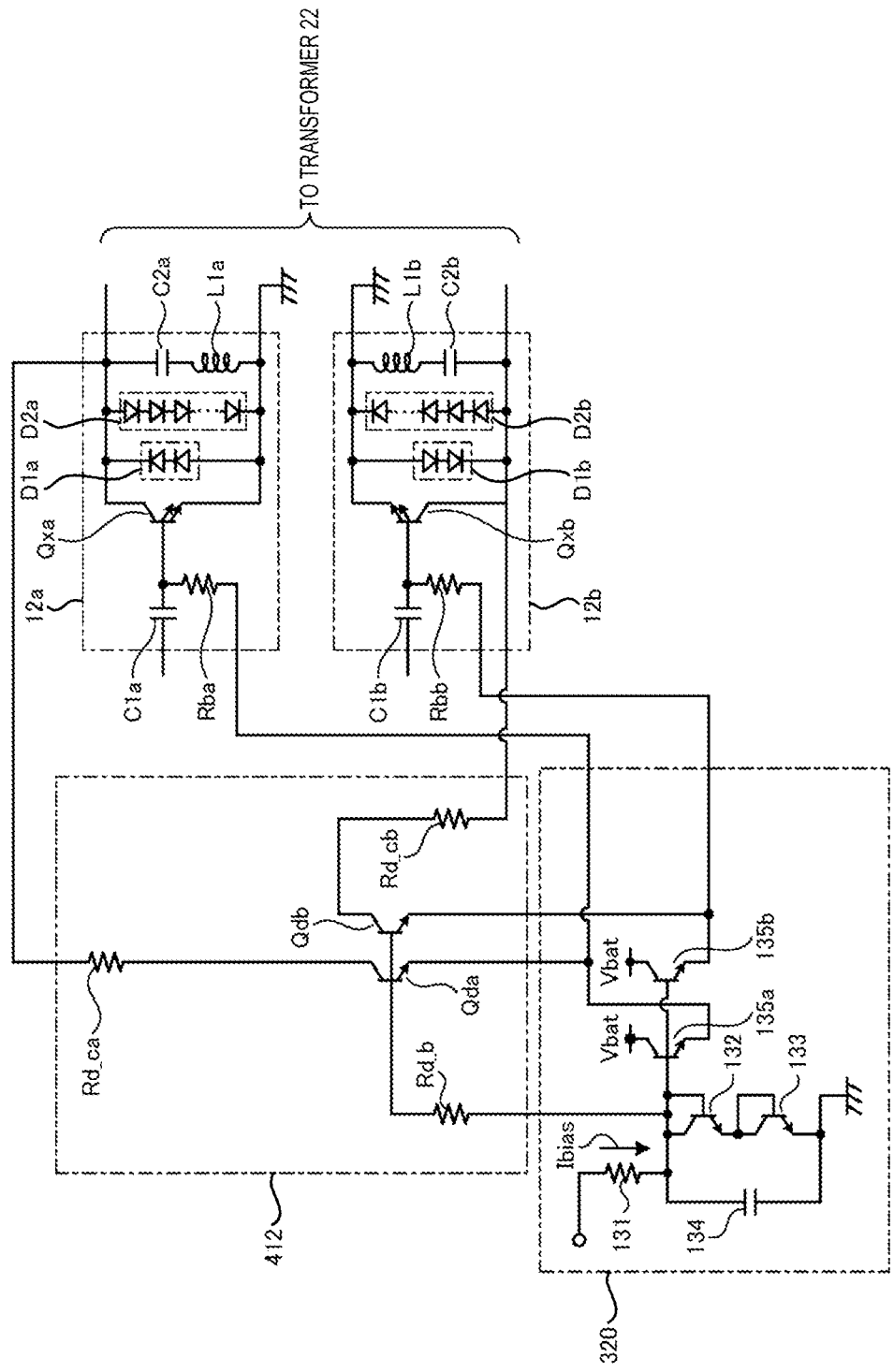
FIG. 8 illustrates a configuration example of a bias circuit and a dispersion circuit in FIG. 7.

Next, a configuration example of the bias circuit and the dispersion circuit in FIG. 7 will be described. FIG. 8 illustrates the configuration example of the bias circuit and the dispersion circuit in FIG. 7. In FIG. 8, a bias circuit 320 corresponds to the bias circuit 32 in FIG. 7. The bias circuit 320 includes transistors 135a and 135b, which correspond to the transistor 135 in FIG. 3. The transistors 135a and 135b share a base. The emitter of the transistor 135a is coupled to the amplifier circuit 12a. The emitter of the transistor 135b is coupled to the amplifier circuit 12b.

In FIG. 8, the dispersion circuit 412 corresponds to the dispersion circuits 41 and 42 in FIG. 7. This means that the dispersion circuit 412 functions as the two dispersion circuits 41 and 42. The dispersion circuit 412 includes transistors Qda and Qdb, which correspond to the transistor Qd. The transistors Qda and Qdb share a base. The dispersion circuit 412 includes resistance elements Rd_ca and Rd_cb, which correspond to the resistance element Rd_c in FIG. 3. The resistance of the resistance element Rd_ca may be, for example, 10 kΩ. The resistance of the resistance element Rd_cb may be, for example, 10 kΩ.

In FIG. 8, the amplifier circuits 12a and 12b forming a differential amplifier circuit have an identical configuration. The amplifier circuit 12a in FIG. 8 corresponds to the amplifier circuit 12a in FIG. 7. The amplifier circuit 12b in FIG. 8 corresponds to the amplifier circuit 12b in FIG. 7.

In FIG. 8, the amplifier circuit 12a includes a resistance element Rba and a transistor Qxa. The resistance element Rba in FIG. 8 corresponds to the resistance element Rb in FIG. 3. The transistor Qxa in FIG. 8 corresponds to the transistor Qx in FIG. 3. The collector of the transistor Qxa is coupled to the collector of the transistor Qda via the resistance element Rd_ca of the dispersion circuit 412.

The amplifier circuit 12a further includes capacitors C1a and C2a, an inductor L1a, and diode groups D1a and D2a. The capacitor C1a is provided in the input stage of the amplifier circuit 12a to cut direct current. One end of the capacitor C2a and one end of the inductor L1a are coupled in series with each other. The other end of the capacitor C2a is coupled to the collector of the transistor Qxa. The other end of the inductor L1a is coupled to the reference potential. The diode groups D1a and D2a are each constituted by a plurality of diodes coupled in series. The diode group D1a is constituted by, for example, two diodes coupled in series. The diode group D2a is constituted by, for example, ten diodes coupled in series. The anode of the diode group D1a is coupled to the reference potential. The cathode of the diode group D2a is coupled to the reference potential.

In FIG. 8, the amplifier circuit 12b includes a resistance element Rbb and a transistor Qxb. The resistance element Rbb in FIG. 8 corresponds to the resistance element Rb in FIG. 3. The transistor Qxb in FIG. 8 corresponds to the transistor Qx in FIG. 3. The collector of the transistor Qxb is coupled to the collector of the transistor Qdb via the resistance element Rdcb of the dispersion circuit 412.

The amplifier circuit 12b further includes capacitors C1b and C2b, an inductor L1b, and diode groups D1b and D2b. The capacitor C1b is provided in the input stage of the amplifier circuit 12b to cut direct current. One end of the capacitor C2b and one end of the inductor L1b are coupled in series with each other. The other end of the capacitor C2b is coupled to the collector of the transistor Qxb. The other end of the inductor L1b is coupled to the reference potential. The diode groups D1b and D2b are each constituted by a plurality of diodes coupled in series. The diode group D1b is constituted by, for example, two diodes coupled in series. The diode group D2b is constituted by, for example, ten diodes coupled in series. The anode of the diode group D1b is coupled to the reference potential. The cathode of the diode group D2b is coupled to the reference potential.

In the configuration described above, the transistor Qxa of the amplifier circuit 12a and the transistor Qxb of the amplifier circuit 12b independently operate and output differential signals. Thus, the symmetry of differential signals can be maintained.

The operation of the bias circuit 320 and the dispersion circuit 412 configured as described above is identical to the operation of the bias circuit 32 and the dispersion circuit 4 described with reference to FIG. 3.

The power amplifier circuit 100 according to the comparative example described with reference to FIG. 2 provides the single dispersion circuit 4 for the amplifier circuit 12 as a differential amplifier circuit. In accordance with one of the differential signals in a pair outputted from the amplifier circuit 12, the dispersion circuit 4 controls a bias to be supplied to the amplifier circuit 12. Hence, it is difficult to maintain the symmetry of waveforms of the differential signals outputted from the amplifier circuit 12. By contrast, the power amplifier circuit 100A according to the first embodiment illustrated in FIG. 7 provides the dispersion circuits 41 and 42 for the respective differential signals in a pair. Hence, it is possible to maintain the symmetry of waveforms of the differential signals outputted from the amplifier circuit 12. Thus, when the power amplifier circuit outputs differential signals, an appropriate gain dispersion characteristic can be achieved.

Second Embodiment

Figure 9:
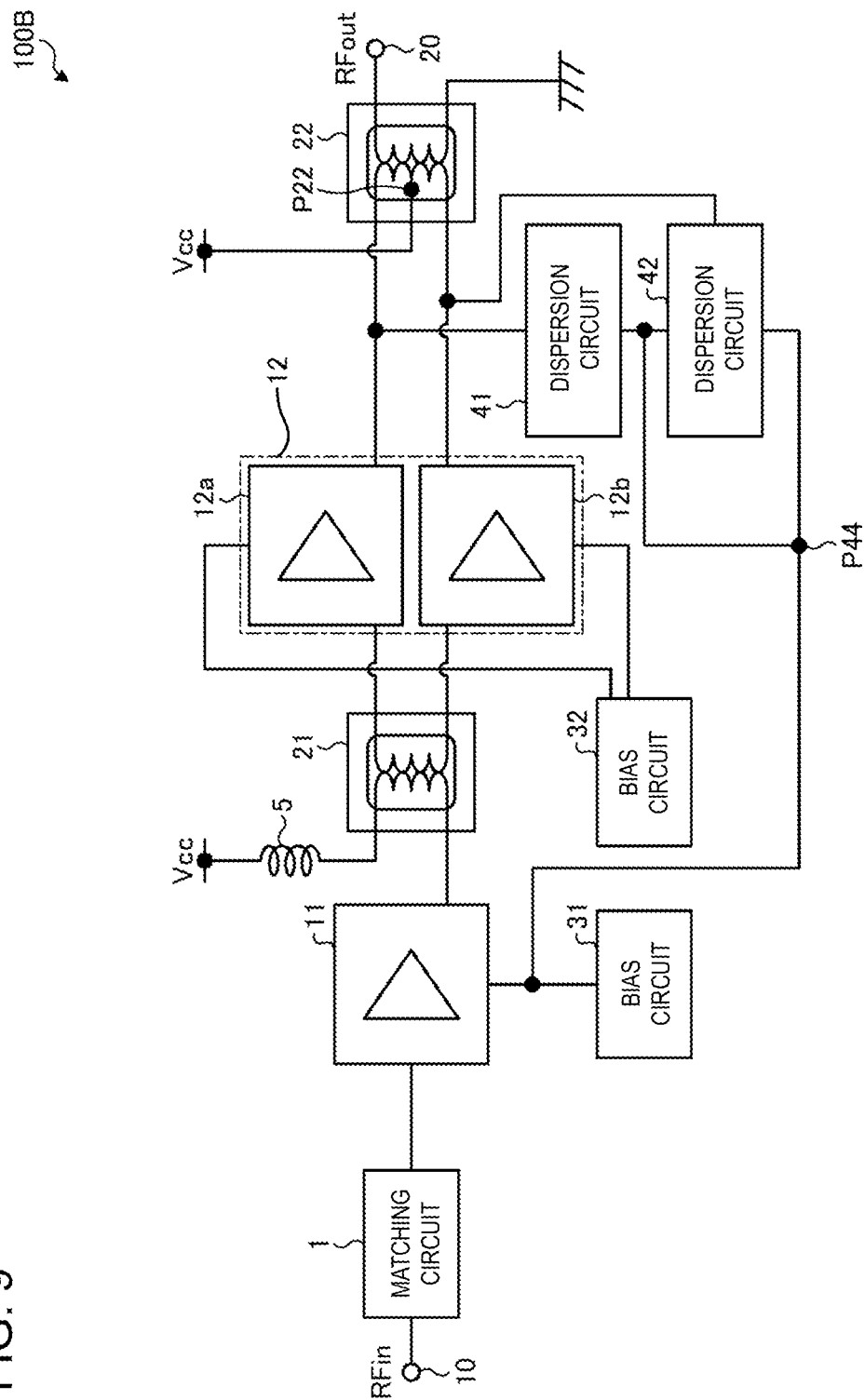
FIG. 9 illustrates an example of a power amplifier circuit according to a second embodiment.

FIG. 9 illustrates an example of a power amplifier circuit 100B according to the second embodiment. As illustrated in FIG. 9, the power amplifier circuit 100B according to the second embodiment differs from the power amplifier circuit 100A according to the first embodiment described with reference to FIG. 7 in that the dispersion circuits 41 and 42 are coupled to the bias circuit 31 in the drive stage. With this configuration, the bias supplied to the amplifier circuit 11 is controlled. The power amplifier circuit 100B includes, in addition to the amplifier circuit 12 configured as a differential amplifier circuit, the other amplifier circuit 11 in a stage before the amplifier circuit 12, and the bias circuit 31 supplies a bias to the other amplifier circuit 11.

The output signal from the dispersion circuit 41 and the output signal from the dispersion circuit 42 are combined together at a connection point P44 and inputted to the bias circuit 31. By combining differential signals outputted from the amplifier circuit 12 before inputting the differential signals to the bias circuit 31, an RF component can be removed. Because the RF component is removed, only a direct current component can be extracted and inputted to the bias circuit 31. Because the output signal from the bias circuit 31 is inputted to the amplifier circuit 11 in the drive stage, variations in linearity can be reduced.

The power amplifier circuit 100B according to the second embodiment provides the dispersion circuits 41 and 42 for the respective differential signals in a pair outputted from the amplifier circuit 12. Hence, it is possible to maintain the symmetry of waveforms of the differential signals outputted from the amplifier circuit 12. Thus, when the power amplifier circuit outputs differential signals, an appropriate gain dispersion characteristic can be achieved.

Third Embodiment

Figure 10:
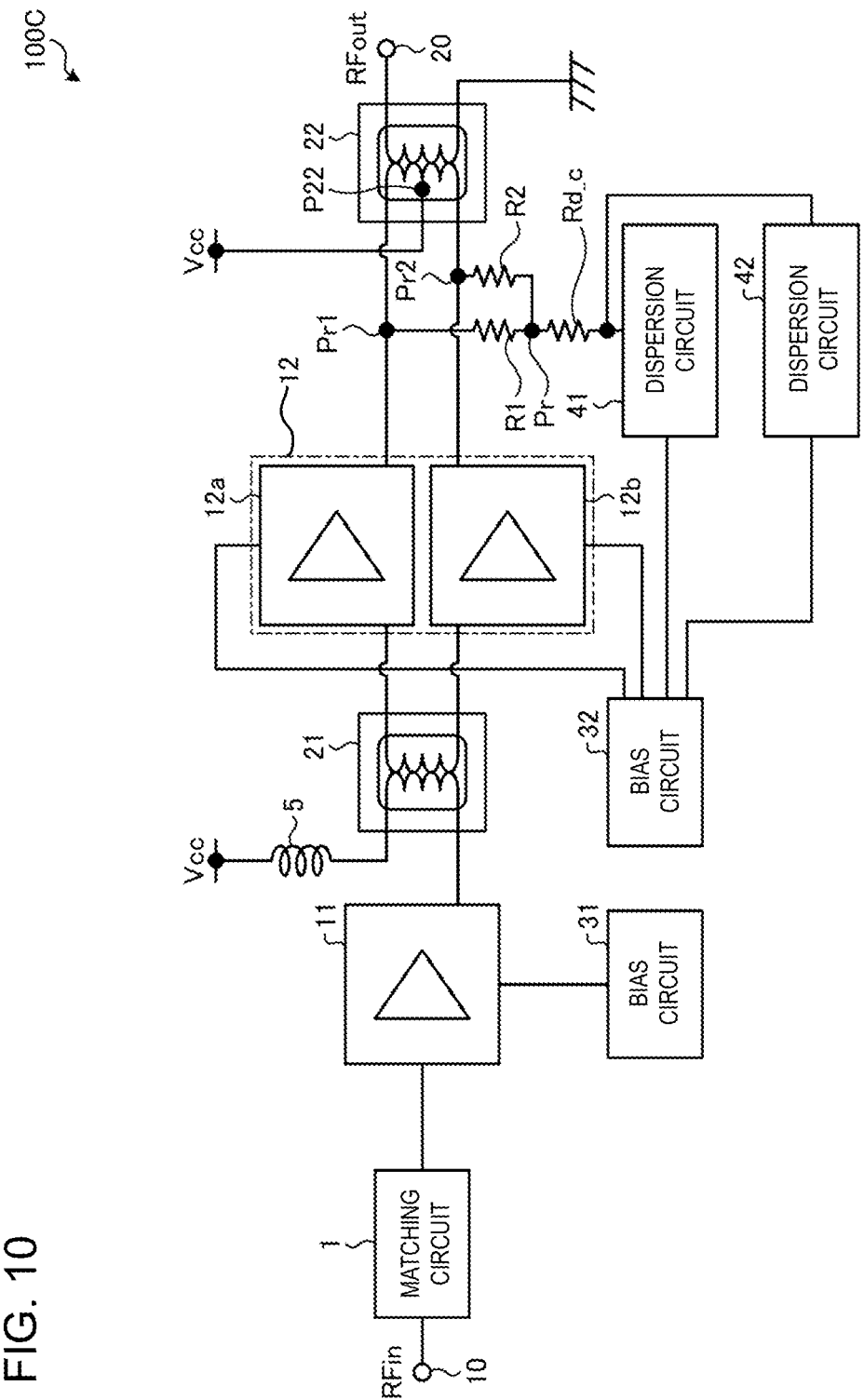
FIG. 10 illustrates an example of a power amplifier circuit according to a third embodiment.

FIG. 10 illustrates an example of a power amplifier circuit 100C according to a third embodiment. As illustrated in FIG. 10, the power amplifier circuit 100C according to the third embodiment includes the dispersion circuit 41 as the first dispersion circuit and the dispersion circuit 42 as the second dispersion circuit in the same manner as the first embodiment. The dispersion circuits 41 and 42 are respectively provided for differential signals in a pair outputted from the amplifier circuit 12. The dispersion circuits 41 and 42 are coupled to the bias circuit 32 for the power stage. The bias circuit 32 supplies a bias to the amplifier circuit 12. The dispersion circuits 41 and 42 control the bias to be supplied to the amplifier circuit 12.

The power amplifier circuit 100C includes a first resistance element R1 and a second resistance element R2 on the primary side with respect to the transformer 22. The first resistance element R1 is provided for one of the differential signals in a pair, whereas the second resistance element R2 is provided for the other of the differential signals in a pair. One end of the first resistance element R1 and one end of the second resistance element R2 are coupled to each other at a connection point Pr. The other end of the first resistance element R1 is coupled to a connection point Pr1. One of the differential signals in a pair is applied to the other end of the first resistance element R1. The other end of the second resistance element R2 is coupled to a connection point Pr2. The other of the differential signals in a pair is applied to the other end of the second resistance element R2.

The first resistance element R1 is substantially identical in resistance to the second resistance element R2. The expression "substantially identical" denotes that the resistance of the first resistance elements R1 and the resistance of the second resistance element R2 are regarded as the same resistance in the range of manufacturing variations. The same holds for the following description. Because the first resistance element R1 and the second resistance element R2 are substantially identical in resistance to each other, the connection point Pr is the midpoint of the combined resistance formed by coupling the first resistance element R1 and the second resistance element R2 in series with each other. The dispersion circuits 41 and 42 are coupled to the connection point Pr as the midpoint via the resistance element Rd_c, which is a third resistance element, and thus, the dispersion circuits 41 and 42 do not affect the symmetry of differential signals. In the present disclosure, the case in which the resistance elements are "substantially identical" in resistance to each other includes the range including differences due to manufacturing variations but having no effect in design.

Here, bringing into focus the first resistance element R1, the second resistance element R2, and the resistance element Rd_c, the first resistance element R1 and the second resistance element R2 are coupled to each other at the connection point Pr to combine signals, and subsequently, the dispersion circuits 41 and 42 are coupled to the connection point Pr via the resistance element Rd_c. This configuration can achieve total resistance less than the circuit configuration described with reference to FIG. 8. The resistance of the first resistance element R1 and the resistance of the second resistance element R2 may be, for example, 500Ω; the resistance of the resistance element Rd_c may be, for example, 5 kΨ.

Figure 11:
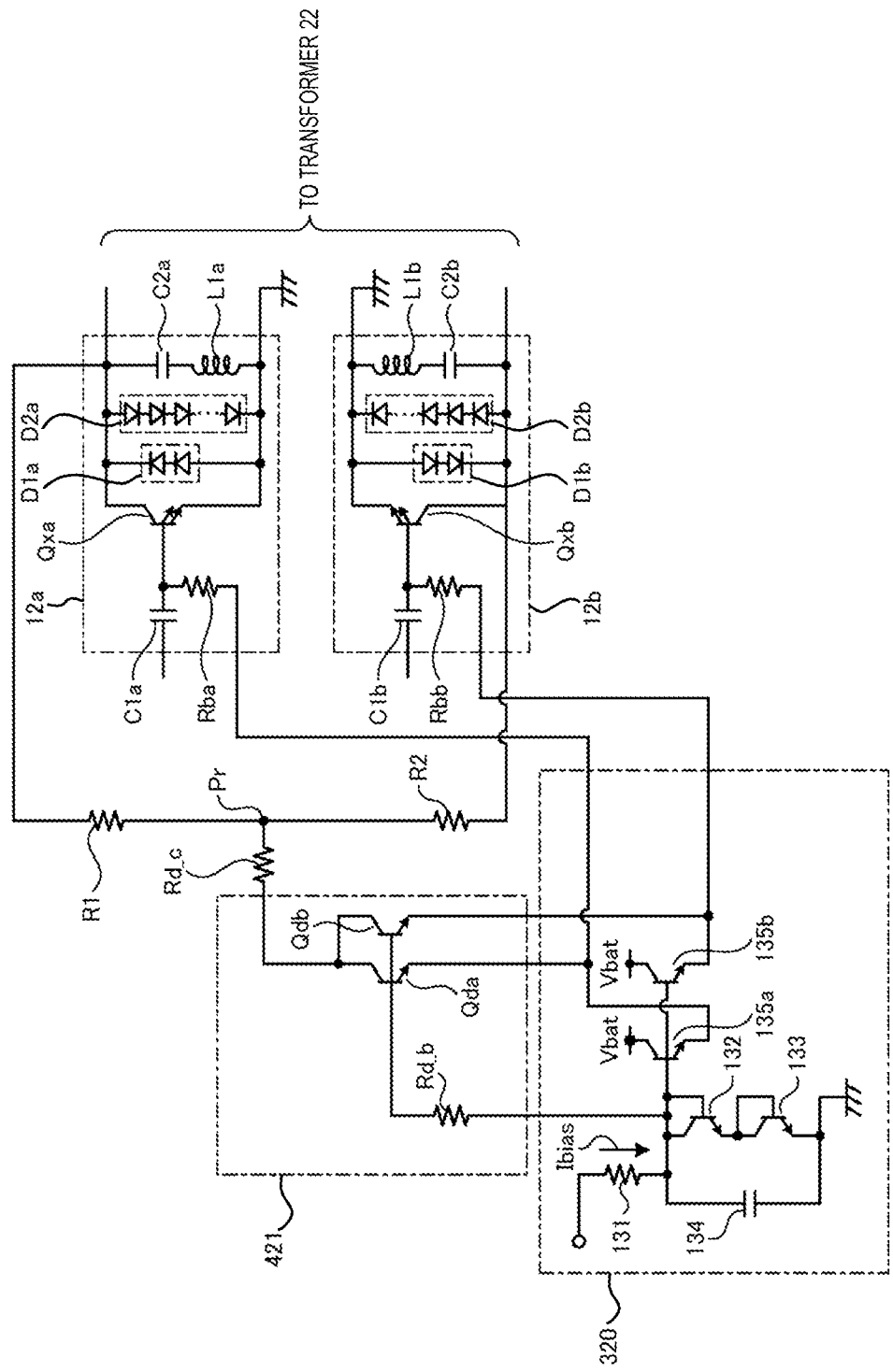
FIG. 11 illustrates a configuration example of a bias circuit and a dispersion circuit in FIG. 10.

Next, a configuration example of the bias circuit and the dispersion circuit in FIG. 10 will be described. FIG. 11 illustrates the configuration example of the bias circuit and the dispersion circuit in FIG. 10. In FIG. 11, the bias circuit 320 corresponds to the bias circuit 32 in FIG. 10. The bias circuit 320 is configured in the same manner as the bias circuit 320 described with reference to FIG. 8. The emitter of the transistor 135a is coupled to the amplifier circuit 12a. The emitter of the transistor 135b is coupled to the amplifier circuit 12b.

In FIG. 11, a dispersion circuit 421 corresponds to the dispersion circuits 41 and 42 in FIG. 10. This means that the dispersion circuit 421 functions as the two dispersion circuits 41 and 42. The dispersion circuit 421 includes transistors Qda and Qdb, which correspond to the transistor Qd. The transistors Qda and Qdb share a base. The collector of the transistor Qda and the collector of the transistor Qdb are coupled to the resistance element Rd_c. The resistance element Rd_c corresponds to the resistance element Rd_c in FIG. 3. Thus, the resistance element Rd_c can be regarded as a part of the dispersion circuit 421. The resistance of the resistance element Rd_c may be, for example, 5 kΩ.

In FIG. 11, the amplifier circuits 12a and 12b forming a differential amplifier circuit have an identical configuration. The amplifier circuit 12a in FIG. 11 corresponds to the amplifier circuit 12a in FIG. 10. The amplifier circuit 12b in FIG. 11 corresponds to the amplifier circuit 12b in FIG. 10. The amplifier circuits 12a and 12b in FIG. 11 are configured in the same manner as the amplifier circuits 12a and 12b described with reference to FIG. 8.

The collector of the transistor Qxa of the amplifier circuit 12a is coupled to the first resistance element R1. The collector of the transistor Qxb of the amplifier circuit 12b is coupled to the second resistance element R2. One end of the first resistance element R1 and one end of the second resistance element R2 are coupled to each other at the connection point Pr. The resistance element Rd_c is coupled to the connection point Pr. With this configuration, differential signals are short-circuited via the first resistance element R1 and R2. As a result, the effect on the transformer 22 is eliminated, and only an in-phase component can be applied to the transistors Qda and Qdb of the dispersion circuit.

As described above, the connection point Pr is the midpoint of the combined resistance formed by coupling the first resistance element R1 and the second resistance element R2 in series with each other. The dispersion circuit 421 is coupled to the connection point Pr as the midpoint, and thus, the dispersion circuit 421 does not affect the symmetry of differential signals.

The operation of the bias circuit 320 and the dispersion circuit 421 configured as described above is identical to the operation of the bias circuit 32 and the dispersion circuit 4 described with reference to FIG. 3.

As described with reference to FIGS. 10 and 11, in the power amplifier circuit 100C according to the third embodiment, the dispersion circuit 421 (41, 42) is coupled to terminals on the primary side of the transformer 22 as an output transformer. By transferring differential signals through the first resistance element R1 and the second resistance element R2 coupled to the terminals on the primary side of the transformer 22, the differential signals are combined together before the differential signals are transferred to the dispersion circuit 421. The first resistance element R1 and the second resistance element R2 remove RF components from differential signals to extract only direct current components. Because differential signals are combined together before being transferred to the dispersion circuit 421, the resistance of the resistance element Rd_c in the dispersion circuit 421 can be reduced. Reduction in the resistance of the resistance element Rd_c can decrease the layout area for the power amplifier circuit at a substrate. By using the midpoint of the first resistance element R1 and the second resistance element R2, it is unnecessary to provide a dedicated pad or bump, and as a result, it is possible to suppress an increase in the mounting area.

Because the dispersion circuit 421 is coupled to the connection point Pr as the midpoint, the dispersion circuit 421 can be isolated from radio-frequency signals, and consequently, it is possible to reduce the resistance of the resistance element Rd_c as a part of the dispersion circuit 421. By decreasing the resistance of the resistance element Rd_c, the solid lines SL1 to SL4 described with reference to FIG. 5 can be inclined at larger angles, and as a result, the range of variations in gain can be widened (refer to FIG. 6).

Usually, when a dispersion circuit is coupled on the output side with respect to an amplification stage or coupled to a line for radio-frequency signals, the dispersion circuit needs to have a resistance in the order of several thousands of Ω to achieve isolation. By contrast, when the dispersion circuit is coupled to the connection point Pr as the midpoint as in the present disclosure, the dispersion circuit achieves isolation. As a result, the resistance can be reduced to the order of several hundreds of Ω, such that the solid lines SL1 to SL4 described with reference to FIG. 5 are inclined at larger angles.

Fourth Embodiment

Figure 12:
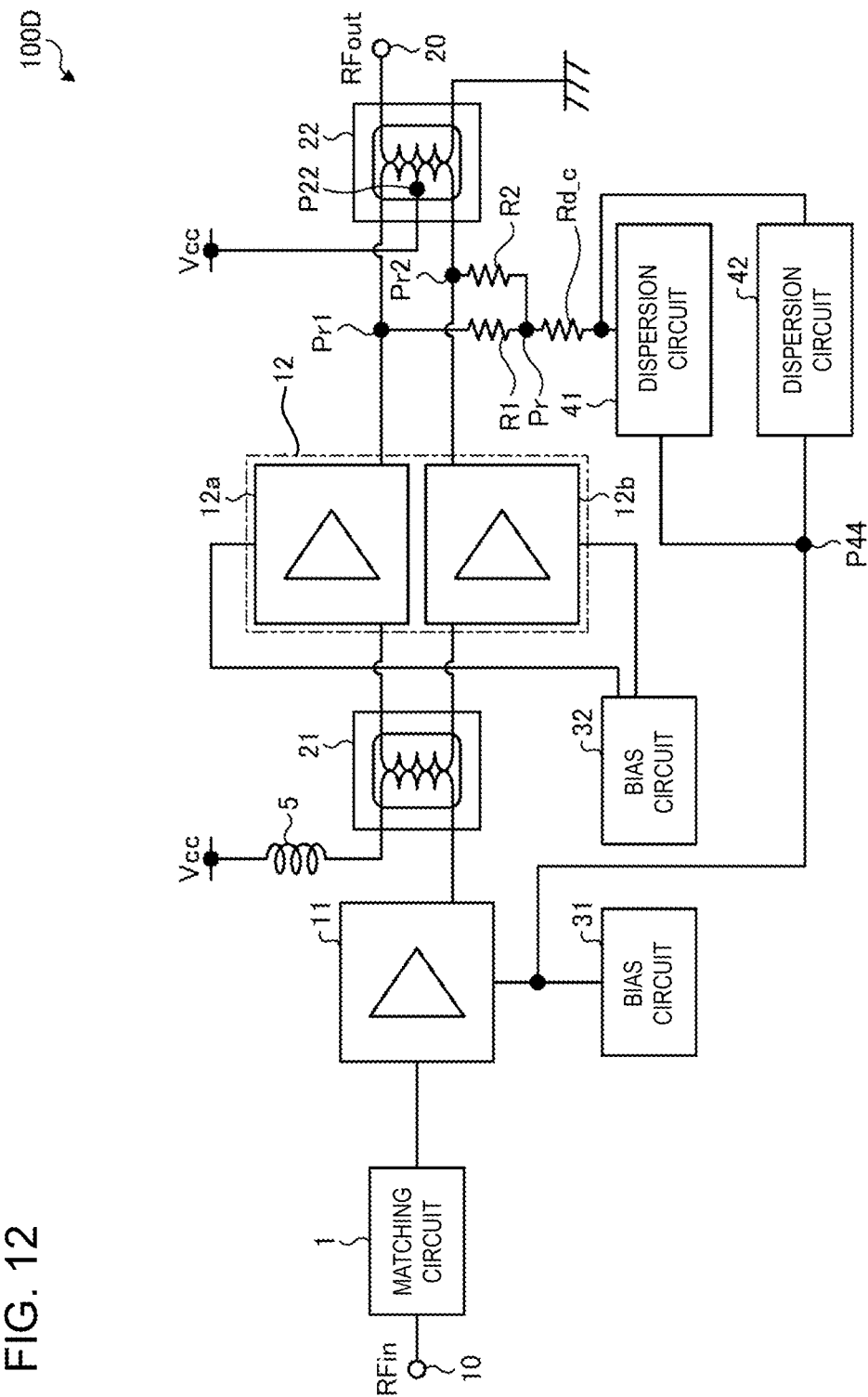
FIG. 12 illustrates an example of a power amplifier circuit according to a fourth embodiment.

FIG. 12 illustrates an example of a power amplifier circuit 100D according to a fourth embodiment. As illustrated in FIG. 12, the power amplifier circuit 100D according to the fourth embodiment includes the dispersion circuits 41 and 42. The dispersion circuits 41 and 42 are coupled to the bias circuit 31 for the drive stage. The dispersion circuits 41 and 42 control the bias to be supplied to the amplifier circuit 11. The power amplifier circuit 100D includes, in addition to the amplifier circuit 12 configured as a differential amplifier circuit, the other amplifier circuit 11 in a stage before the amplifier circuit 12, and the bias circuit 31 supplies a bias to the other amplifier circuit 11.

The power amplifier circuit 100D according to the fourth embodiment includes, in the same manner as the third embodiment, the first resistance element R1 and the second resistance element R2 on the primary side with respect to the transformer 22. The first resistance element R1 is provided for one of the differential signals in a pair, whereas the second resistance element R2 is provided for the other of the differential signals in a pair. The dispersion circuits 41 and 42 are coupled via the resistance element Rd_c as the third resistance element to the connection point Pr, which is the midpoint of the combined resistance formed by coupling the first resistance element R1 and the second resistance element R2 in series with each other. As a result, the dispersion circuits 41 and 42 do not affect the symmetry of differential signals. In the same manner as the third embodiment, the first resistance element R1 and the second resistance element R2 remove RF components from differential signals to extract only direct current components. Reduction in the resistance of the resistance element Rd_c can decrease the layout area for the power amplifier circuit at a substrate.

Fifth Embodiment

Figure 13:
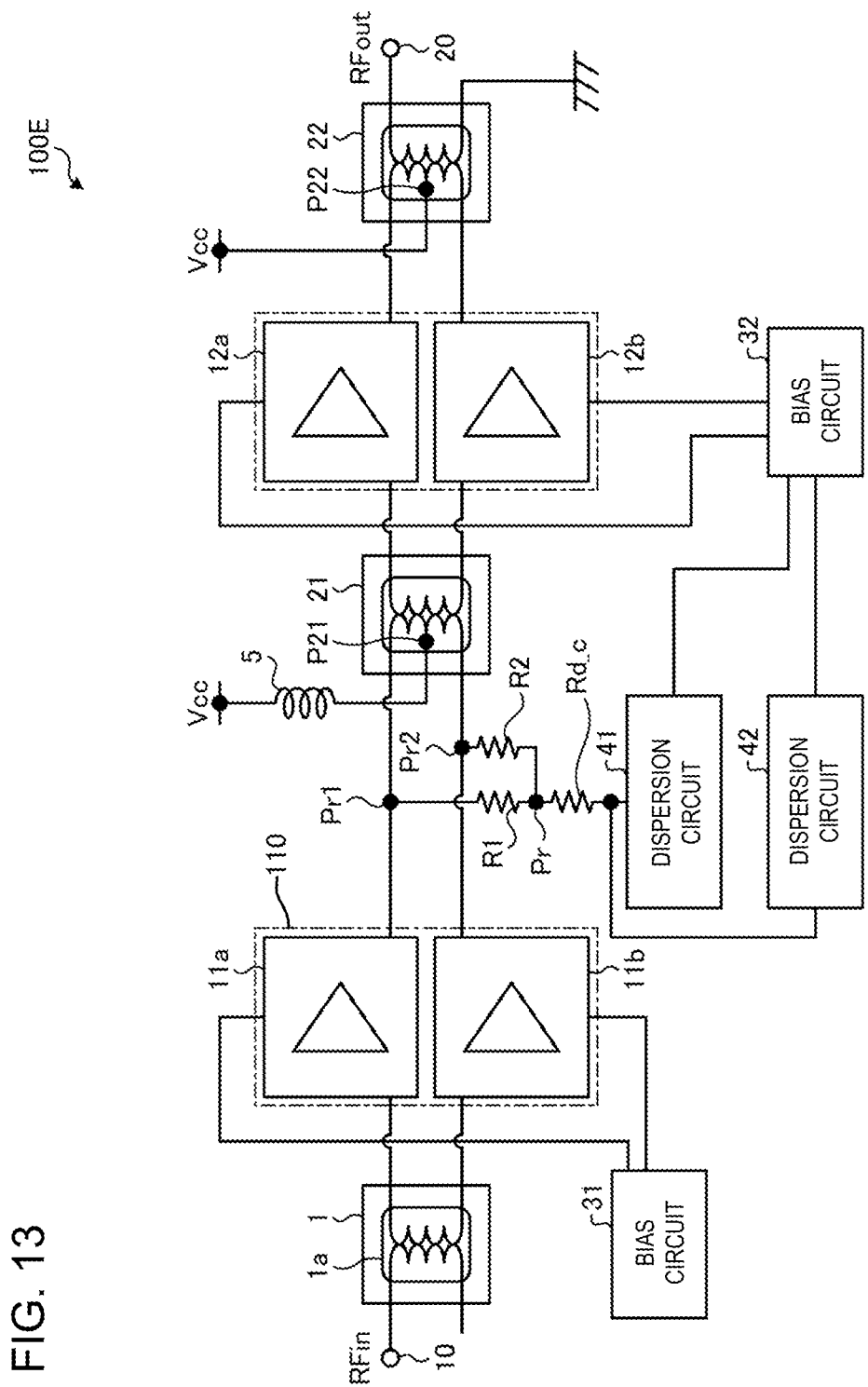
FIG. 13 illustrates an example of a power amplifier circuit according to a fifth embodiment.

FIG. 13 illustrates an example of a power amplifier circuit 100E according to a fifth embodiment. As illustrated in FIG. 13, the power amplifier circuit 100E according to the fifth embodiment includes an amplifier circuit 110 and the amplifier circuit 12. The amplifier circuits 110 and 12 are both differential amplifier circuits. The amplifier circuit 110 is an amplifier circuit in the drive stage. The amplifier circuit 12 is an amplifier circuit in the power stage.

The power amplifier circuit 100E includes the dispersion circuits 41 and 42. The dispersion circuits 41 and 42 are coupled to the bias circuit 32 for the power stage. The dispersion circuits 41 and 42 control the bias to be supplied to the amplifier circuit 12. The power amplifier circuit 100E includes, in addition to the amplifier circuit 110 configured as a differential amplifier circuit, the other amplifier circuit 12 in a stage after the amplifier circuit 110, and the bias circuit 32 supplies a bias to the amplifier circuit 12.

The matching network 1 of the power amplifier circuit 100E includes a transformer 1a. The primary side of the transformer 1a is coupled to the input terminal 10. The secondary side of the transformer 1a is configured to output differential signals. The secondary side of the transformer 1a outputs signals to the amplifier circuit 110. Differential signals are outputted from the secondary side of the transformer 1a. The amplifier circuit 110 includes amplifier circuits 11a and 11b, which form a differential amplifier circuit. Differential signals outputted from the amplifier circuits 11a and 11b are inputted to the transformer 21.

The transformer 21 is provided between the amplifier circuit 110 and the amplifier circuit 12. The transformer 21 is positioned on the output side with respect to the amplifier circuit 110. The transformer 21 is positioned on the input side with respect to the amplifier circuit 12. The winding on the input side of the transformer 21 is coupled to the output terminal of the amplifier circuit 11. A midpoint P21 of the winding on the input side of the transformer 21 is coupled to the supply voltage Vcc via the inductor 5.

The power amplifier circuit 100E includes the first resistance element R1 and the second resistance element R2 on the primary side with respect to the transformer 21. The first resistance element R1 is provided for one of the differential signals in a pair, whereas the second resistance element R2 is provided for the other of the differential signals in a pair. One end of the first resistance element R1 and one end of the second resistance element R2 are coupled to each other at the connection point Pr. The other end of the first resistance element R1 is coupled to the connection point Pr1. One of the differential signals in a pair is applied to the other end of the first resistance element R1. The other end of the second resistance element R2 is coupled to the connection point Pr2. The other of the differential signals in a pair is applied to the other end of the second resistance element R2.

Also in the fifth embodiment, the first resistance element R1 and the second resistance element R2 are substantially identical in resistance to each other. The expression "substantially identical" denotes that the resistance of the first resistance elements R1 and the resistance of the second resistance element R2 are regarded as the same resistance in the range of manufacturing variations. Because the first resistance element R1 and the second resistance element R2 are substantially identical in resistance to each other, the connection point Pr is the midpoint of the combined resistance formed by coupling the first resistance element R1 and the second resistance element R2 in series with each other. The dispersion circuits 41 and 42 are coupled via the resistance element Rd_c as the third resistance element to the connection point Pr as the midpoint. As a result, the dispersion circuits 41 and 42 do not affect the symmetry of differential signals. In the same manner as the third embodiment, the first resistance element R1 and the second resistance element R2 remove RF components from differential signals to extract only direct current components. Reduction in the resistance of the resistance element Rd_c can decrease the layout area for the power amplifier circuit at a substrate.

Sixth Embodiment

Figure 14:
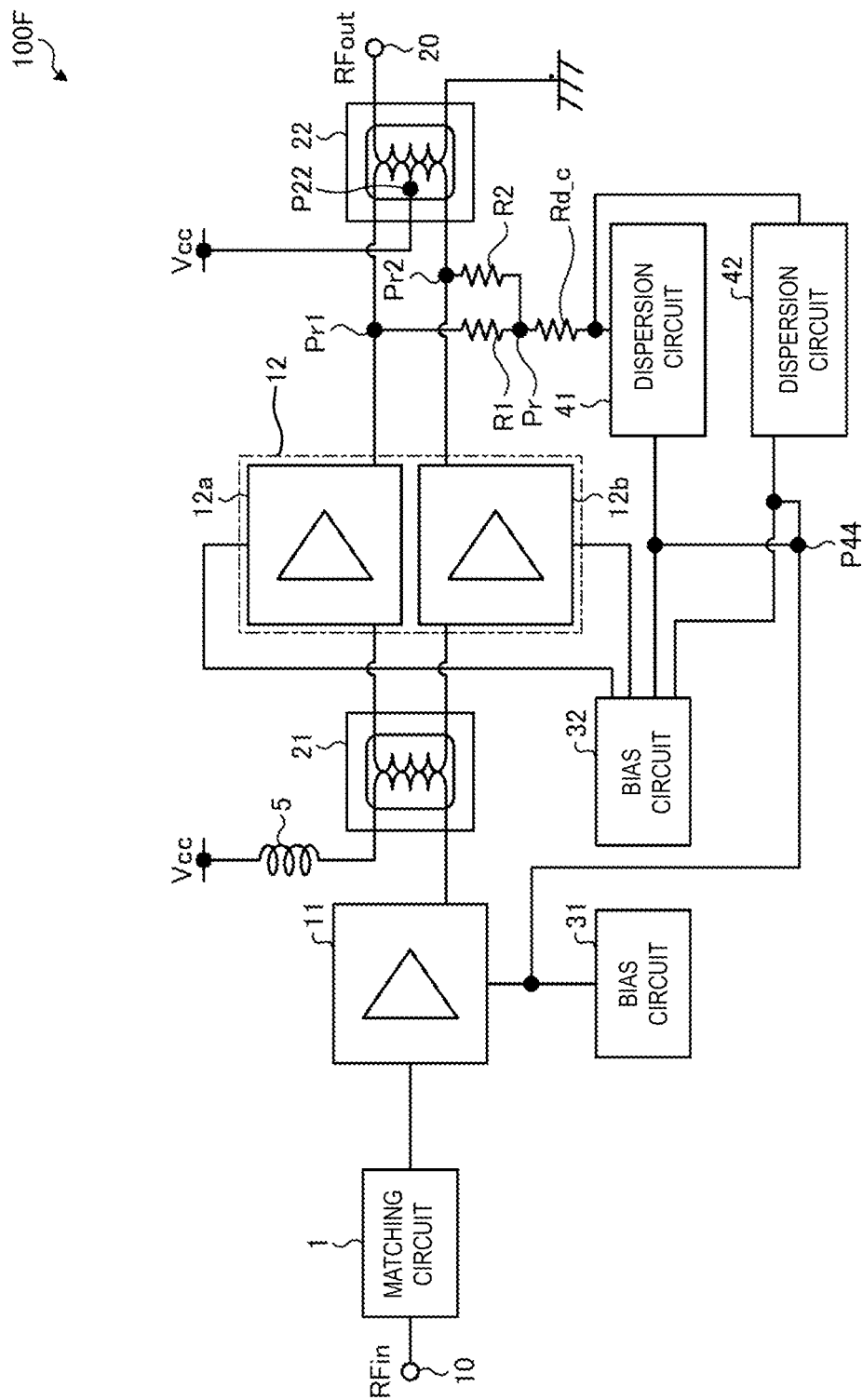
FIG. 14 illustrates an example of a power amplifier circuit according to a sixth embodiment.

FIG. 14 illustrates an example of a power amplifier circuit 100F according to a sixth embodiment. As illustrated in FIG. 14, the power amplifier circuit 100F according to the sixth embodiment includes the dispersion circuits 41 and 42 in the same manner as the power amplifier circuit 100D according to the fourth embodiment. The dispersion circuits 41 and 42 are coupled to the bias circuit 31 for the drive stage. The dispersion circuits 41 and 42 control the bias to be supplied to the amplifier circuit 11. The dispersion circuits 41 and 42 are also coupled to the bias circuit 32 for the power stage. The dispersion circuits 41 and 42 control the bias to be supplied to the amplifier circuit 12.

The power amplifier circuit 100F includes, in addition to the amplifier circuit 12 as a differential amplifier circuit, the other amplifier circuit 11 in a stage before the amplifier circuit 12. The power amplifier circuit 100F further includes the other bias circuit 31 provided for the amplifier circuit 11. The bias circuit 32 supplies a bias to the amplifier circuit 12, whereas the bias circuit 31 supplies a bias to the amplifier circuit 11. In the same manner as the third embodiment, the first resistance element R1 and the second resistance element R2 remove RF components from differential signals to extract only direct current components. Reduction in the resistance of the resistance element Rd_c can decrease the layout area for the power amplifier circuit at a substrate.

Modifications Regarding Bias Circuit

Figure 15:
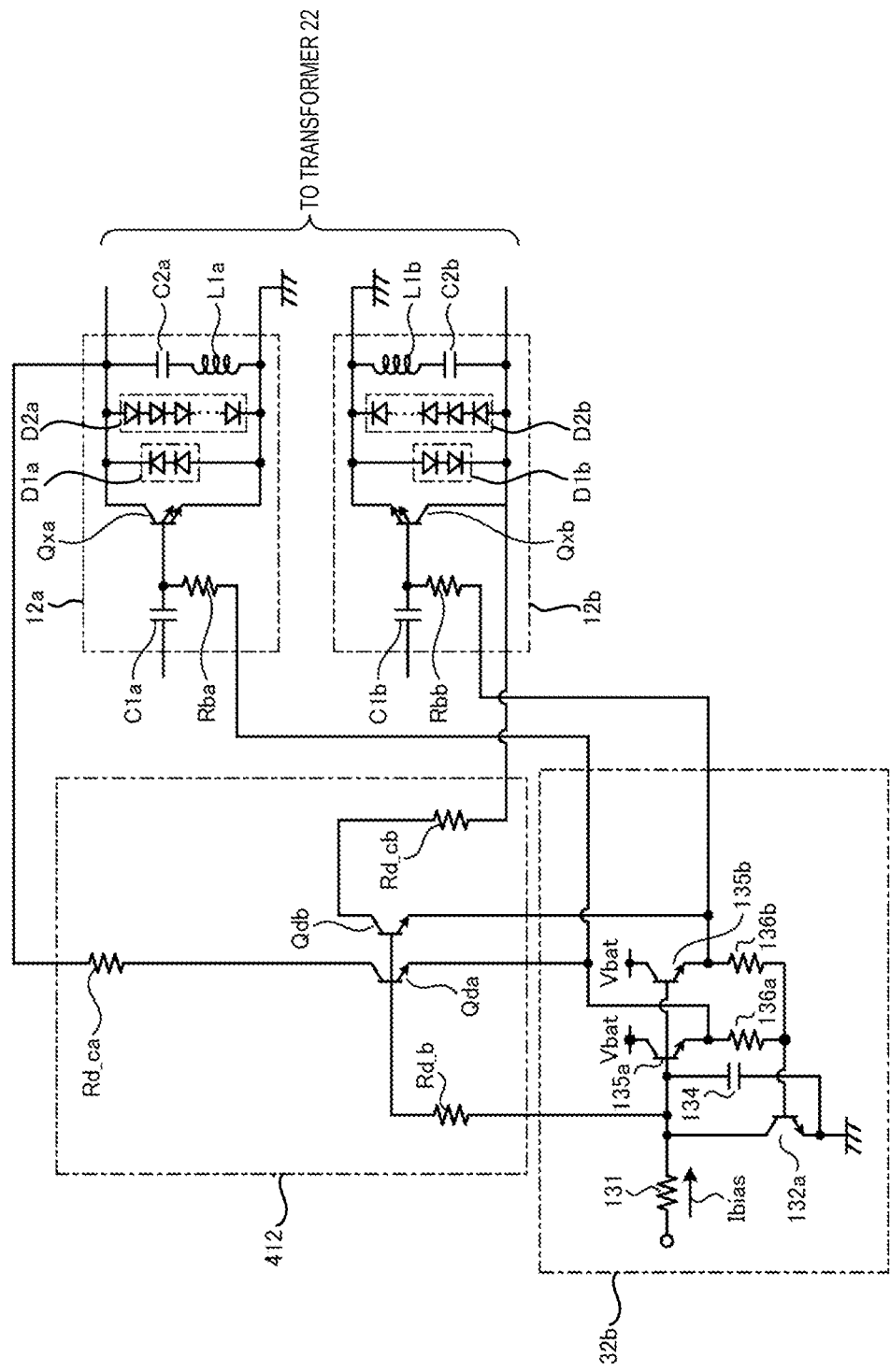
FIG. 15 illustrates a configuration example of a bias circuit and a dispersion circuit according to a modification.
Figure 16:
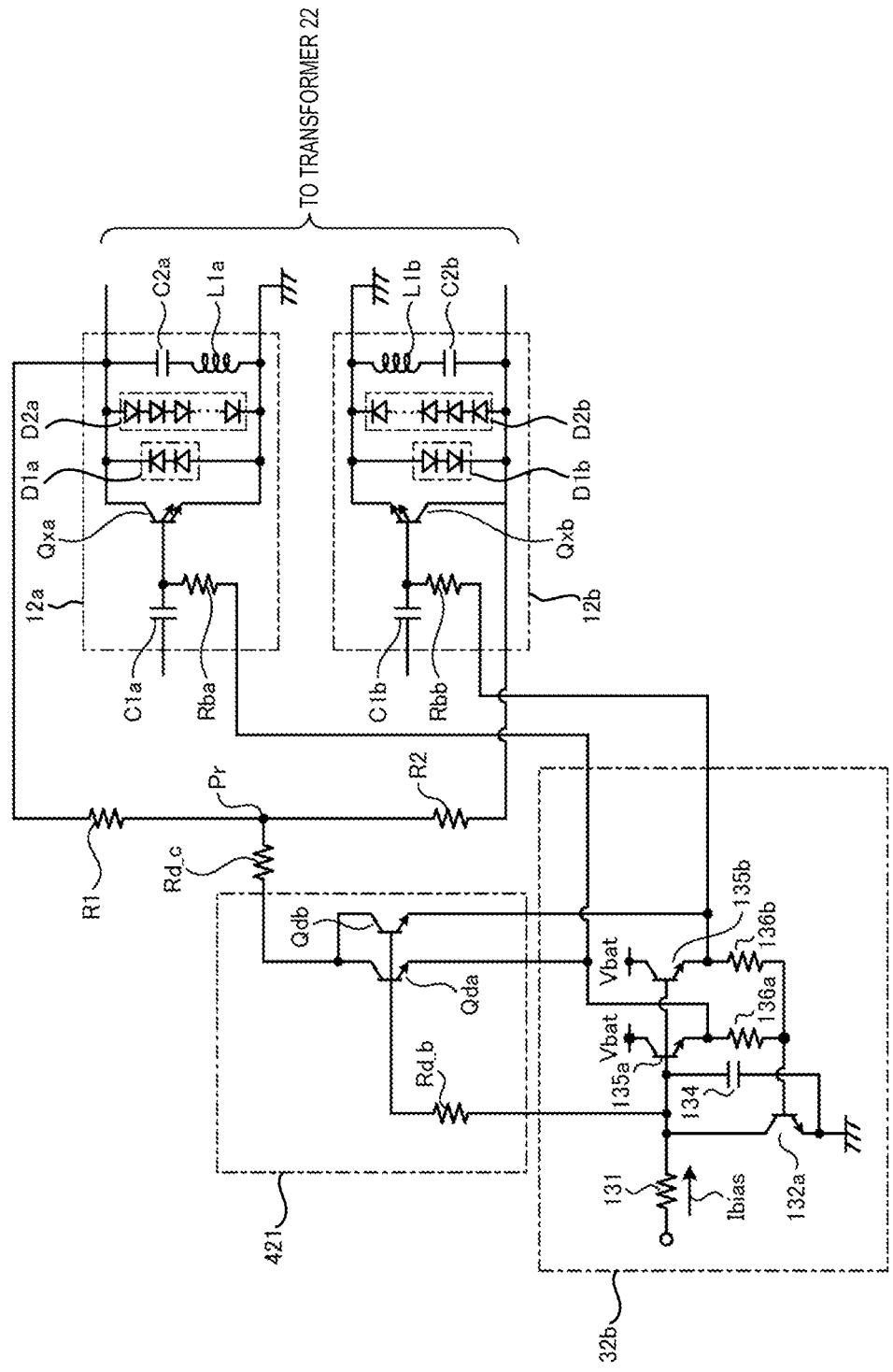
FIG. 16 illustrates a configuration example of a bias circuit and a dispersion circuit according to another modification.

FIGS. 15 and 16 illustrate modifications regarding the bias circuit. FIG. 15 illustrates an example in which the bias circuit 32 in the power amplifier circuit 100A according to the first embodiment described with reference to FIG. 8 is replaced with a feedback bias circuit 32b.

The bias circuit 32b includes resistors 136a and 136b and the transistor 132a. One end of the resistor 136a is coupled to the emitter of the transistor 135a. The other end of the resistor 136a is coupled to the base of the transistor 132a. One end of the resistor 136b is coupled to the emitter of the transistor 135b. The other end of the resistor 136b is coupled to the base of the transistor 132a. The collector of the transistor 132a is coupled to the base of the transistor 135a and the base of the transistor 135b. The emitter of the transistor 132a is coupled to the reference potential. Other parts of the configuration of the bias circuit 32b are identical to those of the configuration of the bias circuit 32a described with reference to FIG. 5.

The bias circuit 32b includes a feedback circuit that feeds back part of the emitter current of the transistor 135a to control the on-state of the transistor 132a, in the same manner as the bias circuit 32a. With this configuration, the bias circuit 32b can supply a constant amount of bias current to the amplifier circuit 12a. The bias circuit 32b feeds back part of the emitter current of the transistor 135b to control the on-state of the transistor 132a, in the same manner as the bias circuit 32a. With this configuration, the bias circuit 32b can supply a constant amount of bias current to the amplifier circuit 12b. As a result, excellent linearity of gain of the power amplifier circuit 100A can be maintained.

FIG. 16 illustrates an example in which the bias circuit 32 in the power amplifier circuit 100C according to the third embodiment described with reference to FIG. 11 is replaced with the feedback bias circuit 32b. The configuration and operation of the bias circuit 32b are identical to those of the bias circuit 32b described with reference to FIG. 15. Accordingly, the bias circuit 32b can supply a constant amount of bias current to the amplifier circuits 12a and 12b. As a result, excellent linearity of gain of the power amplifier circuit 100C can be maintained.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
   a differential amplifier circuit configured to be activated by a supply voltage, the supply voltage varying in accordance with a varying amplitude of a signal;
   a bias circuit configured to output a bias to the differential amplifier circuit; and
   first and second dispersion circuits configured to control a dependency of a gain of the differential amplifier circuit on the supply voltage, the first and second dispersion circuits being respectively provided for a pair of differential signals outputted from the differential amplifier circuit.

2. The power amplifier circuit according to claim 1, further comprising:
   a transformer, the pair of differential signals outputted from the differential amplifier circuit being inputted to the transformer,
   wherein the first and second dispersion circuits are coupled to a primary side of the transformer.

3. A power amplifier circuit comprising:
   a differential amplifier circuit configured to be activated by a supply voltage, the supply voltage varying in accordance with a varying amplitude of a signal;
   a bias circuit configured to output a bias to the differential amplifier circuit;
   first and second dispersion circuits configured to control a dependency of a gain of the differential amplifier circuit on the supply voltage, the first and second dispersion circuits being respectively provided for a pair of differential signals outputted from the differential amplifier circuit;
   a first resistor through which a first of the pair of differential signals outputted from the differential amplifier circuit passes between the differential amplifier circuit and the first dispersion circuit; and
   a second resistor through which a second of the pair of differential signals passes between the differential amplifier circuit and the second dispersion circuit, wherein:
   a resistance of the first resistor and a resistance of the second resistor are substantially identical,
   a first end of the first resistor and a first end of the second resistor are coupled to each other,
   the first of the pair of differential signals is inputted to a second end of the first resistor,
   the second of the pair of differential signals is inputted to a second end of the second resistor, and
   the first and second dispersion circuits are coupled to the first ends of the first and second resistors.

4. The power amplifier circuit according to claim 3, further comprising:
   a transformer, the pair of differential signals outputted from the differential amplifier circuit being inputted to the transformer,
   wherein the second end of the first resistor and the second end of the second resistor are coupled to a primary side of the transformer.

5. The power amplifier circuit according to claim 1, wherein the bias circuit is configured to supply the bias to the differential amplifier circuit.

6. The power amplifier circuit according to claim 3, wherein the bias circuit is configured to supply the bias to the differential amplifier circuit.

7. The power amplifier circuit according to claim 1, further comprising:
   a second amplifier circuit in a stage after the differential amplifier circuit,
   wherein the bias circuit is configured to supply the bias to the second amplifier circuit.

8. The power amplifier circuit according to claim 3, further comprising:
   a second amplifier circuit in a stage after the differential amplifier circuit,
   wherein the bias circuit is configured to supply the bias to the second amplifier circuit.

9. The power amplifier circuit according to claim 1, further comprising:
   a second amplifier circuit in a stage before the differential amplifier circuit,
   wherein the bias circuit is configured to supply the bias to the second amplifier circuit.

10. The power amplifier circuit according to claim 3, further comprising:
    a second amplifier circuit in a stage before the differential amplifier circuit,
    wherein the bias circuit is configured to supply the bias to the second amplifier circuit.

11. The power amplifier circuit according to claim 1, further comprising:
    a second amplifier circuit in a stage before the differential amplifier circuit; and
    a second bias circuit, wherein:
    the bias circuit is configured to supply the bias to the differential amplifier circuit, and
    the second bias circuit is configured to supply a second bias to the second amplifier circuit.

12. The power amplifier circuit according to claim 3, further comprising:
    a second amplifier circuit in a stage before the differential amplifier circuit; and
    a second bias circuit, wherein:
    the bias circuit is configured to supply the bias to the differential amplifier circuit, and
    the second bias circuit is configured to supply a second bias to the second amplifier circuit.

13. The power amplifier circuit according to claim 1, wherein the bias circuit comprises a feedback circuit configured to feed back a part of the bias such that the bias is maintained at a constant level.

14. The power amplifier circuit according to claim 3, wherein the bias circuit comprises a feedback circuit configured to feed back a part of the bias such that the bias is maintained at a constant level.

* * * * *